US008941113B2

(12) United States Patent
Takeuchi et al.

(10) Patent No.: US 8,941,113 B2
(45) Date of Patent: Jan. 27, 2015

(54) SEMICONDUCTOR ELEMENT, SEMICONDUCTOR DEVICE, AND MANUFACTURING METHOD OF SEMICONDUCTOR ELEMENT

(71) Applicant: Semiconductor Energy Laboratory Co., Ltd., Atsugi-shi, Kanagawa-ken (JP)

(72) Inventors: Toshihiko Takeuchi, Kanagawa (JP); Kosei Noda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/803,022

(22) Filed: Mar. 14, 2013

(65) Prior Publication Data

US 2013/0256665 A1    Oct. 3, 2013

(30) Foreign Application Priority Data

Mar. 30, 2012    (JP) .................................. 2012-081477

(51) Int. Cl.
*H01L 29/10*    (2006.01)
*H01L 29/04*    (2006.01)
*H01L 29/49*    (2006.01)
(Continued)

(52) U.S. Cl.
CPC ............ *H01L 29/04* (2013.01); *H01L 29/4908* (2013.01); *H01L 29/78618* (2013.01)
USPC .............................. 257/57; 257/213; 438/149

(58) Field of Classification Search
CPC .............. H01L 29/04; H01L 29/78618; H01L 29/4908

USPC ................................................... 257/57, 213
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1 737 044 A1    12/2006
EP    2 226 847 A2    9/2010
(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
(Continued)

*Primary Examiner* — Armando Rodriguez
*Assistant Examiner* — Mohammed R Alam
(74) *Attorney, Agent, or Firm* — Fish & Richardson P.C.

(57) ABSTRACT

To provide a semiconductor element in which generation of oxygen vacancies in an oxide semiconductor thin film can be suppressed. The semiconductor element has a structure in which, in a gate insulating film, the nitrogen content of regions which do not overlap with a gate electrode is higher than the nitrogen content of a region which overlaps with the gate electrode. A nitride film has an excellent property of preventing impurity diffusion; thus, with the structure, release of oxygen in the oxide semiconductor film, in particular, in the channel formation region, to the outside of the semiconductor element can be effectively suppressed.

7 Claims, 15 Drawing Sheets

(51) Int. Cl.
*H01L 29/786* (2006.01)
*H01L 27/148* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,777,763 B1* | 8/2004 | Zhang et al. .................. 257/408 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0060919 A1* | 3/2006 | Chang ........................ 257/347 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0061299 A1* | 3/2008 | Takemura et al. .............. 257/71 |
| 2008/0073653 A1 | 3/2008 | Iwasaki |
| 2008/0083950 A1 | 4/2008 | Pan et al. |
| 2008/0083956 A1 | 4/2008 | Mise et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0087044 A1 | 4/2010 | Shichi et al. |
| 2010/0092800 A1 | 4/2010 | Itagaki et al. |
| 2010/0109002 A1 | 5/2010 | Itagaki et al. |
| 2012/0012852 A1* | 1/2012 | Ohtani ......................... 257/72 |
| 2012/0161121 A1 | 6/2012 | Yamazaki |
| 2012/0161124 A1 | 6/2012 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 A | 6/2006 |
| JP | 2007-096055 A | 4/2007 |
| JP | 2007-123861 A | 5/2007 |
| JP | 2007-208160 A | 8/2007 |
| JP | 2010-109345 A | 5/2010 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosopghical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel Using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

(56) References Cited

OTHER PUBLICATIONS

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

(56) References Cited

OTHER PUBLICATIONS

Kimizuka, N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

SEMICONDUCTOR ELEMENT, SEMICONDUCTOR DEVICE, AND MANUFACTURING METHOD OF SEMICONDUCTOR ELEMENT

BACKGROUND OF THE INVENTION

1. Field of the Invention

The present invention relates to an object, a method, or a manufacturing method. Further, the present invention relates to a process, a machine, manufacture, or a composition of matter. In particular, the present invention relates to a semiconductor element, a semiconductor device, and a method for manufacturing a semiconductor element.

In this specification, a semiconductor device generally means a device which can function by utilizing semiconductor characteristics, and an electro-optic device, a semiconductor circuit, and electronic equipment are all semiconductor devices.

2. Description of the Related Art

Transistors including a semiconductor thin film which is formed over a substrate having an insulating surface and serves as an active layer are widely used in electronic devices such as integrated circuits (ICs) and image display devices (display devices). A silicon-based semiconductor material is widely known as a material for a semiconductor thin film applicable to a transistor. As another material, an oxide semiconductor has been attracting attention.

For example, a thin film transistor in which an oxide semiconductor including an In—Ga—Zn-based oxide is used for an active layer is disclosed (see Patent Document 1).

REFERENCE

Patent Document

[Patent Document 1] Japanese Published Patent Application No. 2006-165527

SUMMARY OF THE INVENTION

For a transistor including a semiconductor thin film as an active layer, a top-gate structure (also referred to as a staggered structure) is employed in some cases in order to miniaturize the transistor. This is because low-resistance regions functioning as a source and a drain are formed by adding an impurity for lowering the resistance of the active layer using a gate electrode as a mask, so that a channel formation region which is sandwiched between the low-resistance regions is formed under the gate electrode in a self-aligned manner (that is, if a miniaturized gate electrode can be formed, a channel formation region can also be miniaturized).

In a transistor including an oxide semiconductor material as a semiconductor thin film (hereinafter, also referred to as an oxide semiconductor (OS) transistor), defects typified by oxygen vacancies in the oxide semiconductor film function as sources for supplying carriers, which might change the electric conductivity of the oxide semiconductor film. Thus, defects typified by oxygen vacancies in the oxide semiconductor film used for the channel formation region are preferably reduced. In particular, oxygen vacancies in the channel formation region are preferably reduced.

However, in the transistor using an OS for an active layer, oxygen in the channel formation region tends to be eliminated during the manufacturing process of the transistor (that is, oxygen vacancies tend to be generated in the channel formation region).

In view of the foregoing problem, one object of the present invention is to provide a top-gate semiconductor element having a structure in which generation of oxygen vacancies in the oxide semiconductor thin film, in particular, in the channel formation region, can be suppressed.

Alternatively, another object of the present invention is to provide a method for manufacturing the semiconductor element.

Further alternatively, another object of the present invention is to provide a semiconductor device including the semiconductor element.

Note that the descriptions of these objects do not disturb the existence of other objects. Note that in one embodiment of the present invention, there is no need to achieve all the objects. Other objects will be apparent from and can be derived from the description of the specification, the drawings, the claims, and the like.

One embodiment of the present invention is a structure in which, in a gate insulating film, the nitrogen content of regions which do not overlap with a gate electrode is higher than the nitrogen content of a region which overlaps with the gate electrode. The present invention relates to a semiconductor element in which release of oxygen in an oxide semiconductor film, in particular, from a channel formation region to the outside of the semiconductor element can be suppressed with the above structure because a nitride film has an excellent property of preventing impurity diffusion. The present invention relates to a semiconductor device including the semiconductor element. The present invention relates to a method for manufacturing the semiconductor element.

A structure in which part of a surface of the oxide semiconductor film is nitrided as well as a side surface of the gate insulating film may be employed. With such a structure, elimination of oxygen from the channel formation region through the oxide semiconductor film can be suppressed. Further, external diffusion of an impurity such as water or hydrogen to the channel formation region can be suppressed.

That is, one embodiment of the present invention is the semiconductor element including the oxide semiconductor film over an insulating surface, the gate insulating film over the oxide semiconductor film, and the gate electrode overlapping with the oxide semiconductor film with the gate insulating film positioned therebetween. In the gate insulating film, the nitrogen content of regions which do not overlap with the gate electrode is higher than the nitrogen content of a region which overlaps with the gate electrode.

With a semiconductor element having such a structure, elimination of oxygen from the oxide semiconductor film can be suppressed by the gate insulating film having a high nitrogen content in regions which do not overlap with the gate electrode (that is, a film having a high property of preventing impurity diffusion). Thus, the electrical characteristics and reliability of the semiconductor element can be excellent.

In the above structure of a semiconductor element, the nitrogen content of the regions in the entire thickness of the gate insulating film in the film thickness direction which do not overlap with the gate electrode is preferably made higher so that elimination of oxygen from the oxide semiconductor film in a region overlapping with the gate electrode can be effectively suppressed.

Further, in the above structure of a semiconductor element, it is preferable to make the nitrogen content of at least a top surface of the oxide semiconductor film which does not overlap with the gate electrode higher than the nitrogen content of a surface in contact with the insulating surface because in such a case, elimination of oxygen can be suppressed also in the top surface of the oxide semiconductor film and impurity diffusion from the outside into the oxide semiconductor film can be suppressed.

The gate insulating film has a staked-layer structure at least including a first insulating film which is in contact with the oxide semiconductor film and contains silicon oxide or aluminum oxide as its main component, and a second insulating film which is over the first insulating film and has a higher dielectric constant than the first insulating film. A side surface of the first insulating film in contact with the oxide semiconductor (which can also be referred to as a region including the side surface) has an excellent property of preventing impurity diffusion, and the second insulating film has a high dielectric constant, whereby the effective thickness of the gate insulating film can be thick. Accordingly, an increase in insulating voltage or a reduction in leakage current can be achieved.

It is preferable that the above semiconductor element have a structure in which a conductive film functioning as a back gate electrode is in a position facing the gate electrode with the oxide semiconductor film positioned between the conductive film and the gate electrode, because in such a case, the semiconductor element can be normally off.

Note that the above "normally off" indicates that a drain current does not flow when voltage is not applied to a gate electrode of a transistor or the drain current is extremely close to zero.

By using the above structure for a semiconductor element included in a variety of semiconductor devices, the semiconductor devices can have high performance and high reliability.

Another embodiment of the present invention is a method for manufacturing a semiconductor element, including the following steps: forming an oxide semiconductor film over an insulating surface; forming a pair of conductive films which is over the oxide semiconductor film and is electrically connected to the oxide semiconductor film; forming an insulating film over the oxide semiconductor film; forming a conductive film over the insulating film; processing the conductive film to form a gate electrode overlapping with the oxide semiconductor film; processing the insulating film using the gate electrode as a mask to form a gate insulating film positioned between the oxide semiconductor film and the gate electrode; and performing nitriding treatment on an exposed surface of the gate insulating film to increase the nitrogen content of at least regions in the gate insulating film which do not overlap with the gate electrode.

With the above method, a region having a high nitrogen content (that is, a region having a high property of preventing impurity diffusion) can be formed in the gate insulating film, so that a semiconductor element in which elimination of oxygen from the oxide semiconductor film is suppressed can be manufactured.

In the above manufacturing method, by performing nitriding treatment on an exposed surface of the oxide semiconductor film as well as the exposed surface of the gate insulating film, a semiconductor element in which elimination of oxygen can be suppressed also in the top surface of the oxide semiconductor film and external diffusion of an impurity to the oxide semiconductor film is suppressed can be manufactured.

Another embodiment of the present invention is a method for manufacturing a semiconductor element, including the following steps: forming an oxide semiconductor film over an insulating surface; forming a pair of conductive films which is over the oxide semiconductor film and is electrically connected to the oxide semiconductor film; forming an insulating film over the oxide semiconductor film; forming a conductive film over the insulating film; processing the conductive film to form a gate electrode overlapping with the oxide semiconductor film; processing the insulating film to form a convex-shaped region overlapping with the gate electrode; performing nitriding treatment on an exposed surface of the insulating film; and removing a region of the insulating film other than the convex-shaped region to form a gate insulating film which overlaps with the oxide semiconductor film and the gate electrode and has nitrided side surfaces.

With the above manufacturing method, nitriding treatment is not performed on an oxide semiconductor film; therefore, part of a channel formation region of a semiconductor element is not nitrided. Thus, the method is preferable particularly when the semiconductor element is miniaturized by reducing a channel length of the semiconductor element.

As the nitriding treatment in the above manufacturing method, plasma treatment is preferably performed in an atmosphere containing nitrogen.

In the above manufacturing method, the gate insulating film has a staked-layer structure at least including a first insulating film which contains silicon oxide or aluminum oxide as its main component and which is in contact with the oxide semiconductor film, and a second insulating film which has a higher dielectric constant than the first insulating film and is in contact with the gate electrode. Accordingly, the semiconductor element has a gate insulating film having an excellent property of preventing impurity diffusion, high withstand voltage, and a small leakage current.

In the method for manufacturing a semiconductor element, an element which can reduce resistance of the oxide semiconductor film is added to the oxide semiconductor film, so that a channel formation region in the oxide semiconductor film, which overlaps with the gate electrode, and a pair of low-resistance regions between which the channel formation region is sandwiched are simultaneously formed.

With the top-gate semiconductor element in which at least the side surface of the gate insulating film is nitrided, generation of oxygen vacancies in the oxide semiconductor thin film can be reduced.

DETAILED DESCRIPTION OF THE INVENTION

Figure 1A:
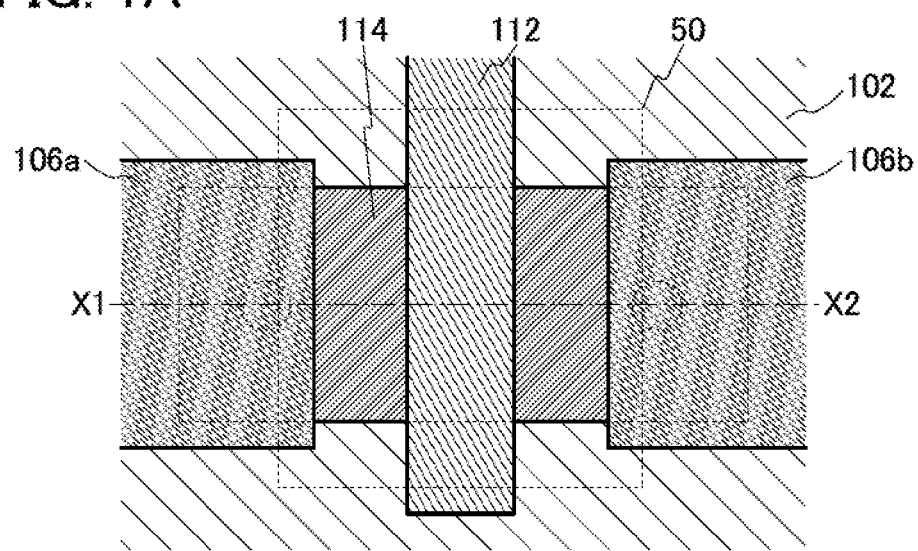
FIGS. 1A and 1B are a plan view and a cross-sectional view illustrating one embodiment of a semiconductor element.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that in the following embodiments, the same portions or portions having similar functions are denoted by the same reference numerals in different drawings, and explanation thereof will not be repeated.

Note that the position, size, range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

In this specification and the like, the term such as "over" or "under" does not necessarily mean that a component is placed "directly on" or "directly underneath" another component. For example, the expression "B over A" can mean the case where another component is provided between A and B.

Embodiment 1

In this embodiment, a structure of a top-gate semiconductor element which can suppress generation of oxygen vacancies in an oxide semiconductor thin film is described with reference to FIGS. 1A and 1B, and a manufacturing method of the semiconductor element is described with reference to FIGS. 2A to 2D and FIGS. 3A to 3C.

<Structural Example of Semiconductor Element>

The structure of the semiconductor element described in this embodiment is described with reference to FIGS. 1A and 1B. Note that FIG. 1A is a top view of a semiconductor element 50, and FIG. 1B is a cross-sectional view taken along dashed-dotted line X1-X2 in FIG. 1A.

Figure 1B:
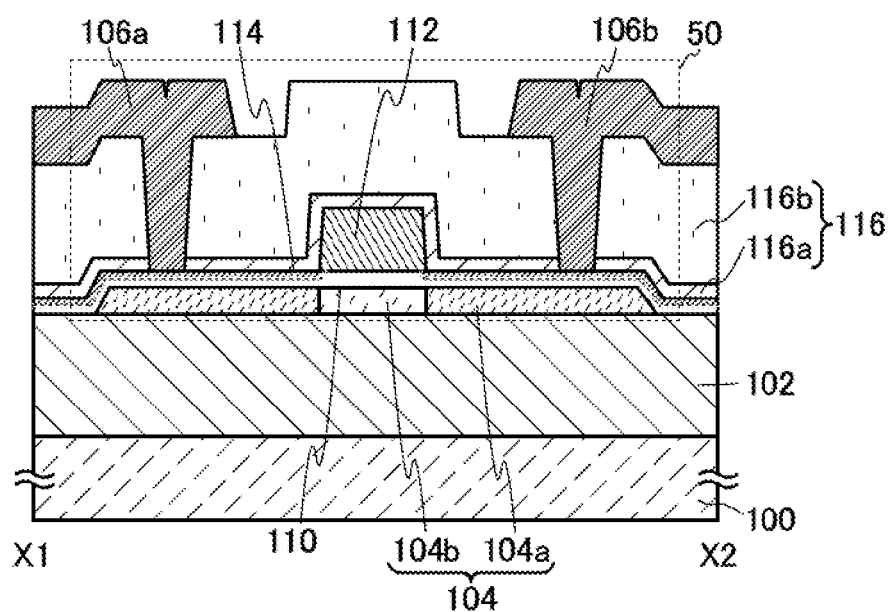

The semiconductor element 50 includes, as illustrated in FIG. 1B, a base film 102 over a substrate 100; an oxide semiconductor film 104 which is over the base film 102 and includes low-resistance regions 104a and a channel formation region 104b; a gate insulating film 110 which is over the oxide semiconductor film 104 and partly includes nitride regions 114; a gate electrode 112 overlapping with the oxide semiconductor film 104 with the gate insulating film 110 positioned therebetween; an insulating film 116 which is over the nitride regions 114 and the gate electrode 112 and includes an insulating film 116a and an insulating film 116b; and a conductive film 106a and a conductive film 106b which are electrically connected to the oxide semiconductor film 104 through openings in the insulating film 116 and function as a source electrode and a drain electrode of the semiconductor element 50. The gate insulating film includes the nitride regions 114 in regions which do not overlap with the gate electrode. The regions have a higher nitrogen content than a region which overlaps with the gate electrode.

In the drawings of this specification, including FIG. 1B, the nitride region 114 (or a nitride region 111, which is described in Embodiment 2 and the subsequent embodiments) is differentiated from another component (e.g., the oxide semiconductor film 104 or the gate insulating film 110) in order to visualize a region having a high nitrogen content. However, a boundary between the oxide semiconductor film 104 and the nitride region 111 or a boundary between the gate insulating film 110 and the nitride region 114 is not clearly observed as in the case where "a difference between film states is clearly observed from a cross-section observation" or "a clear difference between nitrogen contents (which can be referred to as nitrogen concentrations) is clearly observed at a portion as a boundary"

In a semiconductor element including a silicon material as a semiconductor film, it is not common to change the composition of an insulating film in the plane direction in the same film, although the composition of the insulating film in the film thickness direction is intentionally changed in some cases (for example, the insulating film has a stacked-layer structure) in terms of improvement in the characteristics of the interface between the insulating film and a semiconductor film or a gate electrode (for example, a reduction in interface state density), an increase in dielectric constant of the insulating film, or the like.

In contrast, the semiconductor element 50 described in this embodiment has a structure having regions (the nitride regions 114) in which the composition of the gate insulating film 110 is intentionally changed in the plane direction of the film as illustrated in FIG. 1B.

The gate insulating film 110 can be formed using an oxide film or an oxynitride film such as a silicon oxide film, a silicon oxynitride film, an aluminum oxide film, an aluminum oxynitride film, a hafnium oxide film, a hafnium oxynitride film, a hafnium oxide silicate film, or a hafnium oxynitride silicate film. Among these oxide films or oxynitride films, in general, as a film has a closer composition to a nitride film, an impurity in the film has a lower diffusion coefficient.

Thus, only in terms of suppression of elimination of oxygen from the oxide semiconductor film through the gate insulating film 110, the gate insulating film 110 may be a nitride film or a film having a composition close to a nitride film. On the other hand, as the gate insulating film 110 is formed to have a composition closer to a nitride film, the interface state density at the interface between the gate insulating film 110 and a film in contact with the gate insulating film 110 is increased, which might cause an adverse effect on the electrical characteristics of the semiconductor element.

In particular, it can be said that an OS transistor is likely to have the above tendency because an oxide semiconductor film is used for an active layer.

Thus, the gate insulating film has a structure in which the nitrogen content of the regions which do not overlap with the gate electrode is higher than the nitrogen content of the region which overlaps with the gate electrode. That is, the regions which do not overlap with the gate electrode are referred to as the nitride regions 114. Accordingly, elimination of oxygen from the oxide semiconductor film 104 can be suppressed by the nitride regions 114 in the gate insulating film 110.

In addition, since the nitride regions 114 are formed after the gate electrode 112 is formed over the oxide semiconductor film 104, a nitride region is not likely to be formed in a portion below the gate electrode 112, that is, the channel formation region 104b. Thus, as compared to the case where the gate insulating film 110 is formed using a nitride film, the interface state density at the interface between the oxide semiconductor film 104 and the gate insulating film 110 can be decreased.

Accordingly, the semiconductor element 50 can be a transistor with a few oxygen vacancies in a channel formation region, and an increase in the interface state density between the oxide semiconductor film 104 and the gate insulating film 110 can be suppressed; thus, the transistor can have favorable electrical characteristics.

Here, the oxide semiconductor film is in a single crystal state, a polycrystalline (also referred to as polycrystal) state, an amorphous state, or the like.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked-layer structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

Note that in most cases, the crystal part fits inside a cube whose one side is less than 100 nm. In an image obtained with a transmission electron microscope (TEM), a boundary between crystal parts in the CAAC-OS film is not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electrical characteristics due to irradiation with visible light or ultraviolet light is small. Thus, the transistor has high reliability.

Note that a CAAC-OS film used here as the oxide semiconductor film 104 is merely a preferable example, and is not necessarily used. The film quality of the oxide semiconductor film 104 may be selected as appropriate by practitioners in consideration of electrical characteristics or reliability needed for the semiconductor element 50.

<Method for Manufacturing Semiconductor Element>

Next, a method for manufacturing the semiconductor element 50 illustrated in FIGS. 1A and 1B is described with reference to FIGS. 2A to 2D and FIGS. 3A to 3C.

Figure 2A:
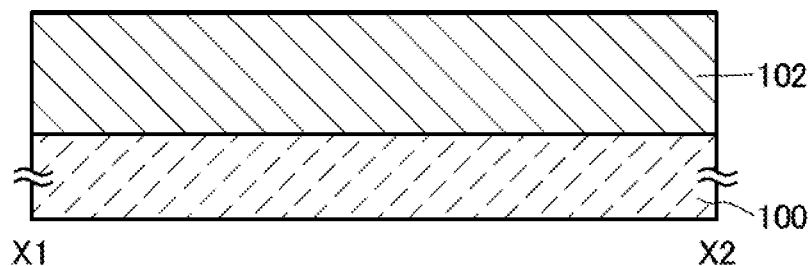
FIGS. 2A to 2D are cross-sectional views illustrating an example of a manufacturing process of a semiconductor element.
Figure 2B:
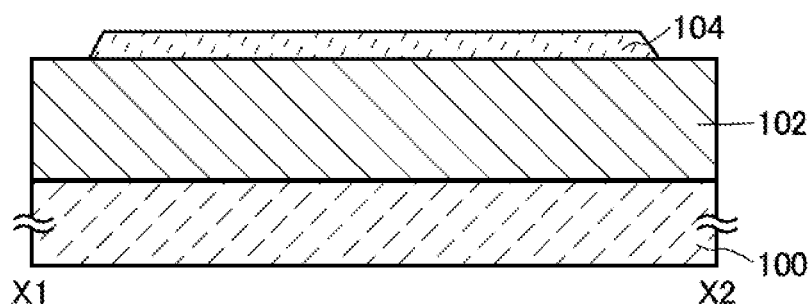

First, the substrate 100 having an insulating surface is prepared, and the base film 102 is formed over the substrate 100 (see FIG. 2A).

There is no particular limitation on a substrate that can be used as the substrate 100 having an insulating surface as long as it has at least heat resistance to withstand heat treatment performed later. For example, a non-alkali glass substrate of barium borosilicate glass, aluminoborosilicate glass, or the like, a ceramic substrate, a quartz substrate, or a sapphire substrate can be used. As long as the substrate 100 has an insulating surface, a single crystal semiconductor substrate or a polycrystalline semiconductor substrate of silicon, silicon carbide, or the like; a compound semiconductor substrate of silicon germanium or the like; an SOI substrate; or the like can be used.

A flexible substrate may alternatively be used as the substrate 100. In the case where a flexible substrate is used, the semiconductor element 50 including the oxide semiconductor film 104 may be directly formed over the flexible substrate, or alternatively, the semiconductor element 50 including the oxide semiconductor film 104 may be formed over another manufacturing substrate and separated from the manufacturing substrate to be transferred to the flexible substrate. Note that in order to separate the transistor from the manufacturing substrate and transfer it to the flexible substrate, a separation layer may be provided between the manufacturing substrate and the semiconductor element including the oxide semiconductor film 104.

Note that the substrate 100 is preferably made to shrink (also referred to as thermally shrink) by heat treatment performed in advance at a temperature lower than a strain point of the substrate 100, whereby shrinkage caused by heating of the substrate in the manufacturing process of the semiconductor element 50 can be suppressed. As a result, the degree of shrinkage due to substrate heating in the manufacturing process of the semiconductor element 50 can be reduced, so that mask misalignment in a light exposure step or the like can be suppressed, for example. Thus, misalignment of masks in a light exposure process or the like can be suppressed, for example. In addition, moisture, organic substances, and the like, which are attached to the surface of the substrate 100, can be removed by the heat treatment.

In this embodiment, non-alkali glass having a thickness of 0.7 mm is used as the substrate 100.

The base film 102 has a function of suppressing diffusion of an impurity (e.g., a metal element such as aluminum, magnesium, strontium, or boron, hydrogen, or water) from the substrate 100 to the oxide semiconductor film 104, and preventing adverse influence on the electrical characteristics of the semiconductor element 50 (for example, preventing a normally-on state of a transistor (shift of the threshold value in the negative direction), the occurrence of variation in threshold value, and a reduction in field-effect mobility).

The base film 102 can be formed by a vacuum evaporation method, a physical vapor deposition (PVD) method such as a sputtering method, or a chemical vapor deposition (CVD) method such as a plasma CVD method to have a single-layer structure or a stacked-layer structure including one or more of a silicon oxide film, a silicon oxynitride film, a silicon nitride film, a silicon nitride oxide film, an aluminum oxide film, an aluminum nitride film, an aluminum oxynitride film, an aluminum nitride oxide film, and the like. Note that in this specification, a "silicon oxynitride film" refers to a film that includes more oxygen than nitrogen, and a "silicon nitride oxide film" refers to a film that includes more nitrogen than oxygen.

In view of improving productivity and preventing diffusion of the impurity, the base film 102 preferably has a thickness greater than or equal to 50 nm and less than or equal to 500 nm, but does not necessarily have a thickness in the above range.

In the semiconductor element 50, when oxygen vacancies exist in the channel formation region 104b, electric charge is generated due to the oxygen vacancies in some cases; thus, the base film 102 preferably contains enough oxygen so as to sufficiently supply oxygen to the oxide semiconductor film 104. Note that here, "to supply oxygen to the oxide semiconductor film 104" means not only "to supply oxygen directly to the island-shaped oxide semiconductor film 104" but also "to supply oxygen to the oxide semiconductor film before being processed into an island shape (oxide semiconductor film which is not patterned yet)". When the description "to supply oxygen to the oxide semiconductor film 104" is made below, it can have the same understanding.

In the case where oxygen is contained in the base film 102, part of oxygen in the base film 102 can be eliminated by later-described heat treatment performed after formation of the oxide semiconductor film 104; therefore, the oxide semiconductor film 104 can be supplied with oxygen and thus oxygen vacancies in the oxide semiconductor film 104 can be filled.

In particular, the base film 102 preferably contains oxygen in a proportion higher than that of oxygen in the stoichiometric composition in (a bulk of) the film. For example, in the case where silicon oxide is used as the base film 102, a film of silicon oxide represented by $SiO_{2+\alpha}$ ($\alpha>0$) is preferably used. Note that a region containing oxygen in a proportion higher than that of oxygen in the stoichiometric composition (hereinafter also referred to as an "oxygen-excessive region") may exist in at least part of the base film 102.

In the case where a function of supplying oxygen to the oxide semiconductor film 104 by heat treatment is given to the base film 102, the base film 102 is preferably formed with a stack of a film having low oxygen permeability and a film having a high oxygen-supplying property so that the oxygen eliminated from the base film 102 is efficiently supplied to the oxide semiconductor film 104. For instance, the base film 102 may be a film in which an aluminum oxide film (which is formed on a side in contact with the substrate 100) having low oxygen permeability and a silicon oxide film (which is formed on a side in contact with the oxide semiconductor film 104) containing oxygen in a proportion higher than that in the stoichiometric composition are stacked.

It is preferable that the base film 102 contains as few hydrogen atoms as possible. This is because when hydrogen atoms are contained in the oxide semiconductor film 104 which is formed later steps, the hydrogen atoms are bonded to an oxide semiconductor, so that part of the hydrogen serves as a donor and electrons serving as carriers are generated, and as a result, the threshold voltage of the transistor is shifted in the negative direction. Therefore, in terms of a reduction in the hydrogen atoms in the film, it is preferable to use physical vapor deposition such as a sputtering method for the deposition of the base film 102, whereas in terms of reductions in variations in plane, particles to be mixed, and formation takt time, it is effective to use a CVD method for the deposition of the base film 102. A CVD method is also effective in forming a film on a large-sized substrate because of the above effect.

In the case where the base film 102 is formed by a CVD method (e.g., a plasma CVD method), a gas containing hydrogen such as a silane gas ($SiH_4$) is used as a deposition gas, and therefore, a large amount of hydrogen is contained in the base film 102.

Therefore, after the base film 102 is formed by a CVD method, heat treatment for the purpose of removal of hydrogen atoms in a film (herein heat treatment for the purpose of removal of hydrogen atom in the film is referred to as "dehydration treatment" or "dehydrogenation treatment") needs to be performed on the deposited base film 102. The heat treatment is performed at a temperature higher than or equal to 250° C. and lower than or equal to 650° C., preferably higher than or equal to 450° C. and lower than or equal to 600° C. or lower than the strain point of the substrate. For example, the substrate may be introduced into an electric furnace, which is one kind of heat treatment apparatuses, and heat treatment may be performed on the base film 102 at 650° C. for one hour in a vacuum (reduced pressure) atmosphere.

Further, the heat treatment apparatus is not limited to an electric furnace, and a device for heating a process object by heat conduction or heat radiation from a heating element such as a resistance heating element may be alternatively used. For example, a rapid thermal annealing (RTA) apparatus such as a gas rapid thermal annealing (GRTA) apparatus, or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high temperature gas, an inert gas which does not react with an object by heat treatment, such as nitrogen or a rare gas like argon, is used. Note that in the case where a GRTA apparatus is used as the heat treatment apparatus, the substrate may be heated in an inert gas heated to high temperature of 650° C. to 700° C. because the heat treatment time is short.

The heat treatment may be performed in an atmosphere of nitrogen, oxygen, ultra-dry air (the moisture content is less than or equal to 20 ppm, preferably less than or equal to 1 ppm, further preferably less than or equal to 10 ppb), or a rare gas (such as argon or helium). Note that it is preferable that water, hydrogen, and the like are not contained in the atmosphere of nitrogen, oxygen, ultra-dry air, a rare gas, or the like. It is also preferable that the purity of nitrogen, oxygen, or the rare gas which is introduced into a heat treatment apparatus is set to be 6N (99.9999%) or higher, preferably 7N (99.99999%) or higher (that is, the impurity concentration is 1 ppm or lower, preferably 0.1 ppm or lower).

In the case where the heat treatment is performed on the base film 102, there is a possibility that part of oxygen as well as hydrogen is removed from the base film 102. Thus, after the above heat treatment is performed, treatment for adding oxygen to the base film 102 is preferably performed (hereinafter, in this specification, treatment for supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state).

Note that the oxygen which is added to the base film 102 by the oxygen adding treatment contains at least one of an oxygen radial, ozone, an oxygen atom, and an oxygen ion (including a molecular ion and a cluster ion). By performing the oxygen adding treatment on the base film 102 which has been subjected to the dehydration treatment or dehydrogenation treatment, oxygen can be contained in the base film 102. Thus, even if oxygen is eliminated from the based film 102 by performing the dehydration treatment or dehydrogenation treatment, oxygen can be compensated in the based film 102 by performing the oxygen adding treatment.

The oxygen adding treatment to the base film 102 can be performed by an ion implantation method, an ion doping method, a plasma immersion ion implantation method, plasma treatment, or the like, for example. Note that as an ion implantation method, a gas cluster ion beam may be used.

The oxygen adding treatment may be performed for the entire surface of the substrate 100 by one step or may be performed using a linear ion beam, for example. In the case where the linear ion beam is used, the substrate or the ion beam is relatively moved (the substrate is scanned), whereby oxygen can be added to the entire surface of the base film 102.

As a supply gas for the oxygen adding treatment, a gas containing O may be used; for example, an $O_2$ gas, an $N_2O$ gas, a $CO_2$ gas, a CO gas, or an $NO_2$ gas may be used. Note that a rare gas (e.g., an Ar gas) may be contained in the supply gas of the oxygen.

In the case where the oxygen adding treatment is performed by an ion implantation method, the dosage of the oxygen is preferably greater than or equal to $1\times10^{13}$ ions/cm$^2$ and less than or equal to $5\times10^{16}$ ions/cm$^2$. The depth at which oxygen is implanted may be adjusted as appropriate by implantation conditions.

In the case where an oxide insulating film is used as the base film 102, it is difficult to accurately estimate the oxygen concentration of the oxide insulating film by a method such as secondary ion mass spectrometry (SIMS) because oxygen is one of its main components in the oxide insulating film. That is, it is difficult to judge whether oxygen is intentionally added to the oxide insulating film or not. The same applies to the case where excessive oxygen contained in the base film 102 is supplied to the oxide semiconductor film in a later step.

Incidentally, it is known that oxygen contains isotopes such as $^{17}O$ and $^{18}O$ and the proportions of $^{17}O$ and $^{18}O$ in all of the oxygen atoms in nature is about 0.038% and about 0.2%, respectively. It is possible to measure the concentrations of these isotopes by a method such as SIMS. Thus, the concentration of the isotope in the base film 102 may be measured to determine whether or not oxygen is intentionally added to the base film 102. Note that the above method can also be applied to the oxide semiconductor film 104 and the gate insulating film 110 which are formed in later steps.

The oxygen eliminated from the base film 102 by the heat treatment performed after the formation of the oxide semiconductor film 104 has not only an effect of compensating the oxygen vacancies in the oxide semiconductor film 104 but also an effect of reducing the interface state density between the base film 102 and the oxide semiconductor film 104. Thus, carrier trapping at the interface between the oxide semiconductor film and the base insulating film due to the operation of a transistor, or the like can be suppressed, and thus, the transistor can have high reliability.

One or both of the oxygen adding treatment and the dehydration treatment (or dehydrogenation treatment) may be performed plural times. For example, when first oxygen adding treatment, dehydration treatment (or dehydrogenation treatment) and second oxygen adding treatment are sequentially performed, i.e., oxygen adding treatment is performed twice, a larger amount of oxygen can be added to the crystal structure by the second oxygen adding treatment because distortion is caused in the crystal structure by the first oxygen adding treatment. As a result, the amount of oxygen released at the time of performing the heat treatment on the base film 102 can be increased.

In the case where the planarity of the base film 102 over which the oxide semiconductor film 104 is formed in a later step is low, the planarity of the oxide semiconductor film 104 is also lowered; accordingly, the electrical characteristics of the semiconductor element 50 are degraded (for example, a reduction in mobility due to existence of unevenness in a channel portion). Thus, the surface planarity of the base film 102 is preferably increased.

As treatment for increasing the surface planarity of the base film 102 (hereinafter, treatment for increasing the surface planarity of a film is referred to as planarization treatment), for example, chemical mechanical polishing (CMP) treatment, a dry etching method, or the like may be used. Note that the CMP treatment may be performed only once or plural times.

The base film 102 may have an average surface roughness ($R_a$) of, specifically, 1 nm or less, preferably 0.3 nm or less, further preferably 0.1 nm or less. Therefore, planarization treatment is preferably performed on a surface over which the oxide semiconductor is to be formed. As the planarization treatment, chemical mechanical polishing treatment, a dry etching method, or the like may be used. Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface over which the oxide semiconductor is to be formed can be further improved.

Note that $R_a$ is obtained by expanding arithmetic mean deviation, which is defined by JIS B 0601, into three dimensions so as to be applicable to a surface. Moreover, $R_a$ can be expressed as average value of the absolute values of deviations from a reference surface to a designated surface and is defined by the following formula.

$$R_a = \frac{1}{S_0} \int_{y_1}^{y_2} \int_{x_1}^{x_2} |f(x, y) - Z_0| dx dy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2,y_1)$), and ($x_2$, $y_2$, $f(x_2, y_2)$). $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

In this embodiment, a 300-nm-thick silicon oxide film is formed by a CVD apparatus as the base film 102, and the surface of the film is planarized by CMP treatment; after that, heat treatment is performed for 1 hour in vacuum as dehydrogenation treat, and as oxygen adding treatment, oxygen is added to the base film 102 using an ion implantation apparatus (accelerating voltage: 60 kV, and dose: $2.0 \times 10^{16}$ cm$^{-2}$).

Next, an oxide semiconductor film is formed over the base film 102 by a physical vapor deposition method such as a vacuum evaporation method or a sputtering method, or a chemical vapor deposition method such as a plasma CVD method. A mask is formed over the oxide semiconductor film by a photolithography method, a printing method, an ink-jet method, or the like. Part of the oxide semiconductor film is selectively removed using the mask, so that the oxide semiconductor film 104 is formed (see FIG. 2B).

An oxide semiconductor used for the oxide semiconductor film 104 contains at least indium (In). In particular, In and zinc (Zn) are preferably contained. In addition, as a stabilizer for reducing variation in electrical characteristics of a transistor formed using the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or more kinds of lanthanoid selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, an In—Zn-based oxide, an In—Mg-based oxide, an In—Ga-based oxide, an In—Ga—Zn-based oxide (also referred to as IGZO), an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Here, for example, the In—Ga—Zn-based oxide means an oxide containing In, Ga, and Zn as its main component and there is no particular limitation on the ratio of In:Ga:Zn. The In—Ga—Zn-based oxide may contain a metal element other than In, Ga, and Zn.

For the oxide semiconductor, a material represented by a chemical formula $InMO_3(ZnO)_m$, (m>0, and m is not an integer) may be used, in which M denotes one or more metal elements selected from Ga, Fe, Mn, and Co. Alternatively, a material represented by $In_2SnO_5(ZnO)_n$, (n>0, and n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, without limitation to the materials given above, a material with an appropriate composition may be used as the oxide semiconductor containing indium depending on needed semiconductor characteristics (e.g., mobility, threshold voltage, and variation). Further, in order to obtain the requisite semiconductor characteristics, it is preferable that the carrier concentration, the impurity concentration, the defect density, the atomic ratio between a metal element and oxygen, the interatomic distance, the density, and the like be set to appropriate values.

For example, high mobility can be obtained relatively easily with an In—Sn—Zn-based oxide. However, the mobility can be increased by reducing the defect density in a bulk, even with an In—Ga—Zn-based oxide.

Note that for example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, for example. The same applies to other oxides.

In order to reduce the oxygen vacancies in the oxide semiconductor film as much as possible, the oxide semiconductor film is preferably formed in a state where the proportion of an oxygen gas to gaseous species in the deposition atmosphere is high. Thus, a sputtering apparatus into which oxygen can be introduced and which can adjust gas flow rate is preferably used. Further, 90% or more of the gas introduced into a deposition chamber of the sputtering apparatus is an oxygen gas, and in the case where another gas is used in addition to the oxygen gas, a rare gas is preferably used. Further, it is more preferable that the gas introduced into the deposition chamber be only an oxygen gas and the percentage of an oxygen gas in the deposition atmosphere be as closer to 100% as possible.

In the formation of the oxide semiconductor film using a sputtering apparatus, any one of a variety of targets having the above compositions may be used as a target. For example, an oxide target with an atomic ratio where In:Ga:Zn=1:1:1, an oxide target with an atomic ratio where In:Ga:Zn=3:1:2, or an oxide target with an atomic ratio where In:Ga:Zn=2:1:3 can be used. Note that the relative density of the target is 90 to 100%, preferably 95 to 99.9%. With the use of the target with a high relative density, a dense oxide semiconductor film can be formed.

It is preferable that the gas used for formation of the oxide semiconductor film do not contain an impurity such as water, hydrogen, a hydroxyl group, or hydride. Further, it is preferable to use a gas having a purity greater than or equal to 6N, preferably greater than or equal to 7N (i.e., the impurity concentration in the gas is less than or equal to 1 ppm, preferably less than or equal to 0.1 ppm).

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Accordingly, the hydrogen concentration in the oxide semiconductor film is preferably lower than $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$, further more preferably lower than or equal to $1 \times 10^{16}$ atoms/cm$^3$. Note that the concentration of hydrogen in the oxide semiconductor film is measured by secondary ion mass spectrometry (SIMS).

In formation of the oxide semiconductor film, in order to remove moisture (including water, water vapor, hydrogen, a hydroxyl group, or hydroxide) in the deposition chamber, an entrapment vacuum pump such as a cryopump, an ion pump, or a titanium sublimation pump is preferably used. The evacuation unit may be a turbo molecular pump provided with a cold trap. From the deposition chamber which is evacuated with a cryopump, a hydrogen atom, a compound containing a hydrogen atom such as water (H$_2$O) (more preferably, also a compound containing a carbon atom), and the like are removed, whereby the concentration of an impurity such as hydrogen or moisture in the oxide semiconductor film 104 formed in the deposition chamber can be reduced.

Further, when the semiconductor film contains an alkali metal or an alkaline earth metal, the alkali metal or the alkaline earth metal and an oxide semiconductor are bonded to each other, so that carriers are generated in some cases, which causes an increase in the off-state current of a transistor. Accordingly, the concentration of an alkali metal or an alkaline earth metal in the oxide semiconductor film 104 is lower than or equal to $1 \times 10^{18}$ atoms/cm$^3$, preferably lower than or equal to $2 \times 10^{16}$ atoms/cm$^3$.

In the case where the CAAC-OS film is formed as the oxide semiconductor film, any of the following three methods may be employed. The first method is the one in which the oxide semiconductor film is formed at a temperature higher than or equal to 200° C. and lower than or equal to 450° C., so that the oxide semiconductor film 104 serves as the CAAC-OS film. The second method is the one in which the oxide semiconductor film 104 is formed and then subjected to heat treatment at a temperature higher than or equal to 200° C. and lower than or equal to 700° C., so that the oxide semiconductor film 104 serves as the CAAC-OS film. The third method is the one in which a first oxide semiconductor film with a small thickness is formed and heat treatment is performed on the first oxide semiconductor film at a temperature higher than or equal to 200° C. and lower than or equal to 700° C., so that the first oxide semiconductor film serves as a CAAC-OS film; then, a second oxide semiconductor film is formed over the first oxide semiconductor film using a crystal in the first oxide semiconductor film as a seed crystal, whereby the second oxide semiconductor film serves as the CAAC-OS film.

Note that before the formation of the oxide semiconductor film, treatment (also referred to as reverse sputtering treatment) in which an argon gas is introduced and plasma is generated to remove powdery substances (also referred to as particles or dust) or an organic substance attached on the surface of the base film 102 is preferably performed. Note that instead of argon, a gas of nitrogen, helium, oxygen or the like may be used.

In this embodiment, a 20-nm-thick IGZO film, which is a CAAC-OS film, is formed using a sputtering apparatus (argon flow rate/oxygen flow rate: 30 sccm/15 sccm, pressure in a chamber: 0.4 Pa, applied power: 0.5 kW (DC), distance between a target and the substrate: 60 mm, and substrate temperature: 200° C.).

Figure 2C:
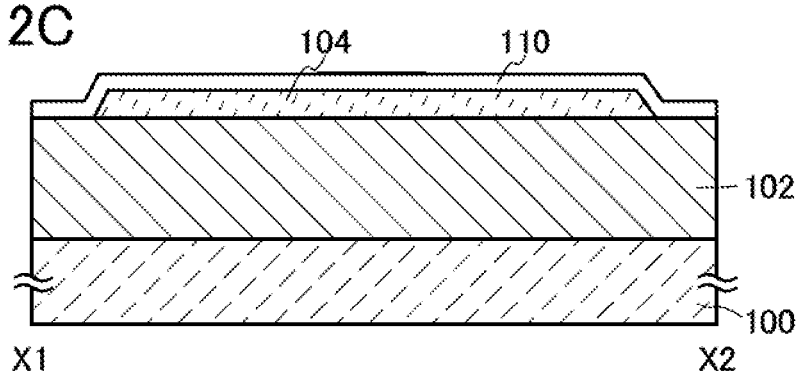

Next, the gate insulating film 110 is formed over the base film 102 and the oxide semiconductor film 104 (see FIG. 2C).

As the insulating film used to form the gate insulating film 110, a film which has a single-layer or stacked-layer structure and is formed using a method and a material similar to those for the base film 102 can be used. A high-k material film such as a hafnium oxide film, a hafnium silicate film (HfSi$_x$O$_y$ (x>0, y>0)), a hafnium silicate film to which nitrogen is added (HfSiO$_x$N$_y$ (x>0, y>0)), or a hafnium aluminate film (HfAl$_x$O$_y$ (x>0, y>0)), may be used as at least part of the gate insulating film 110. Thus, gate leakage current can be reduced.

The gate insulating film 110 is preferably an insulating film formed using a microwave power of 3 kW to 5 kW. For example, nitrous oxide (N$_2$O) and silane (SiH$_4$) are introduced and a microwave power (2.45 GHz) of 3 kW to 5 kW is applied to an electrode at a pressure of 10 Pa to 30 Pa to form a silicon oxynitride film having a thickness of 1 nm to 30 nm (preferably 2 nm to 20 nm) by a vapor-phase growth method, which is to be a gate insulating film. By combining a solid-phase reaction and a reaction due to a vapor deposition method in such a manner, an insulating film having a low interface state density and an excellent withstand voltage can be formed; thus, the film is preferable as the gate insulating film 110.

In this embodiment, a 10-nm-thick silicon oxynitride film is formed using the microwave power of 2.45 GHz.

Figure 2D:
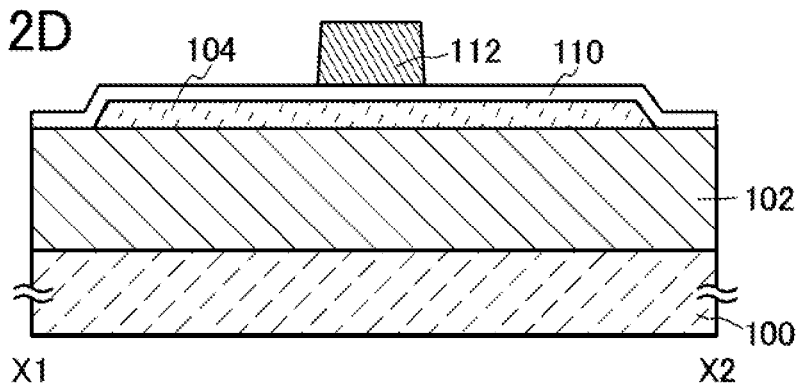

Next, a conductive film is formed over the gate insulating film 110, a mask is formed over the conductive film by a photolithography method, a printing method, an ink-jet method, or the like, and part of the conductive film is selectively removed using the mask, so that the gate electrode 112 is formed (see FIG. 2D).

As the conductive film used for forming the gate electrode 112, a film formed using a method and a material similar to those for the conductive film 106a (and the conductive film 106b) can be used.

Further, at least a surface of the gate electrode 112, which is in contact with the gate insulating film 110, is preferably formed using a material having a work function greater than that of the oxide semiconductor film 104, more preferably having a work function greater than that of the oxide semiconductor film 104 by 1 electron volt or more. As the material, for example, an In—Ga—Zn—O film (IGZO film) containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (an indium nitride film, a zinc nitride film, a tantalum nitride film, a tungsten nitride film, or the like) can be used. These films each have a work function of 5 eV or higher, and thus the threshold voltage in electrical characteristics of the transistor can be positively shifted; consequently, the transistor can be a so-called normally-off transistor. For example, in the case of using an In—Ga—Zn—O film containing nitrogen, an In—Ga—Zn—O film having a nitrogen concentration of higher than at least the oxide semiconductor film 104, specifically, an In—Ga—Zn—O film having a nitrogen concentration of higher than or equal to 7 at. % may be used.

In this embodiment, a 30-nm-thick tantalum nitride film and a 135-nm-thick tungsten film are formed in this order as the conductive film using a sputtering apparatus.

Next, impurity ions 113 which change the conductivity of the oxide semiconductor film 104 are added to the oxide semiconductor film 104. At this time, the gate electrode 112 functions as a mask and thus the low-resistance regions 104a which function as a source region and a drain region and to which the impurity ions 113 are added and the channel formation region 104b sandwiched between the pair of low-resistance regions 104a are formed in the oxide semiconductor film 104 in a self-aligning manner (see FIG. 3A).

One or more selected from the following can be used as the impurity ions 113: Group 15 elements (typified by nitrogen (N), phosphorus (P), arsenic (As), and antimony (Sb)), boron (B), aluminum (Al), argon (Ar), helium (He), neon (Ne), indium (In), fluorine (F), chlorine (Cl), titanium (Ti), and zinc (Zn). Note that because an ion implantation method uses a mass separator with which only necessary ion is extracted, only the impurity ions 113 can be selectively added to an object by an ion implantation method. An ion implantation method is thus preferably employed, in which case the entry of an impurity (e.g., hydrogen) into the oxide semiconductor film 104 is reduced as compared to the case where the ion is added by an ion doping method. Note that the use of an ion doping method is not excluded.

In this embodiment, phosphorus is added to the oxide semiconductor film 104 using an ion implantation apparatus (accelerating voltage: 30 kV, and dose: $3.0 \times 10^{15}$ cm$^{-2}$).

Figure 3A:
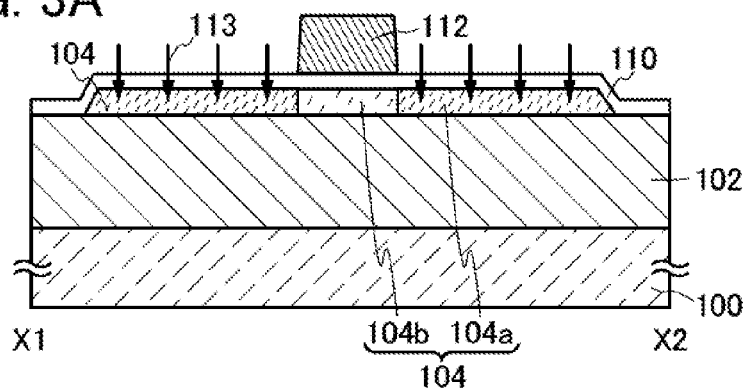
FIGS. 3A to 3C are cross-sectional views illustrating an example of a manufacturing process of a semiconductor element.

As illustrated in FIG. 3A, the impurity ions 113 are added to the oxide semiconductor film 104 through some kind of film (in this embodiment, the gate insulating film 110) which is provided over the oxide semiconductor film 104. Thus, the oxide semiconductor film 104 is not directly damaged by the ion addition, which is advantageous in that the crystallinity of the oxide semiconductor film 104 is not likely to be disordered.

In the case where the low-resistance regions 104a and the channel formation region 104b are formed using the gate electrode 112 as described above, the impurity ions 113 are also added to part of the oxide semiconductor film 104, which overlaps with the gate electrode 112 (specifically, a portion in the vicinity of a side surface of the gate electrode 112 where the gate electrode 112 has a small thickness), and a region having reduced resistance is formed in some cases in part of the portion overlapping with the gate electrode 112. In this case, the region has a smaller added amount of the impurity ions 113 than the low-resistance regions 104a, and has a higher resistance than the low-resistance regions 104a and a lower resistance than the channel formation region 104b. Thus, the region functions as an electric-field relaxation region where an electric-field applied to the channel formation region is relieved.

Note that the above-described treatment for adding the impurity ions 113 to the oxide semiconductor film 104 is preferably performed to lower the resistance of the semiconductor element 50 (which can also be referred to as the resistance between the conductive films 106a and 106b), but is not necessarily performed. For example, in the case where the resistance of the semiconductor element 50 is not so important or the case where high crystallinity is needed in the entire surface of the oxide semiconductor film 104, addition of the impurity ions 113 is not necessarily performed. The same also applies to other embodiments.

Figure 3B:
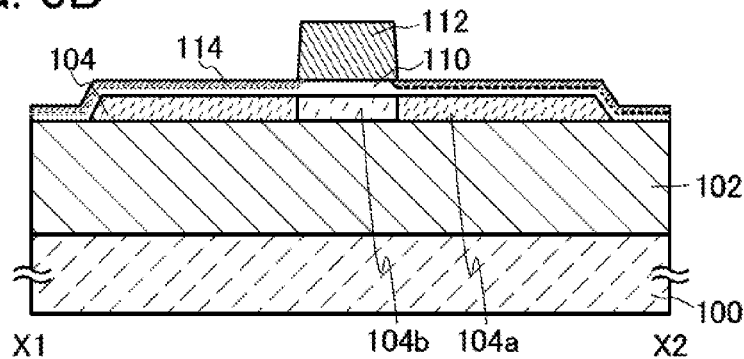

Next, nitriding treatment is performed on exposed portions of the gate insulating film 110, and the nitride regions 114 are formed in at least the regions which do not overlap with the gate electrode 112 (see FIG. 3B).

As compared to the gate insulating film 110, the nitride region 114 has a composition close to a nitride film and has an excellent property of preventing impurity diffusion; thus, elimination of oxygen from the oxide semiconductor film 104 can be effectively suppressed.

Figure 4A:
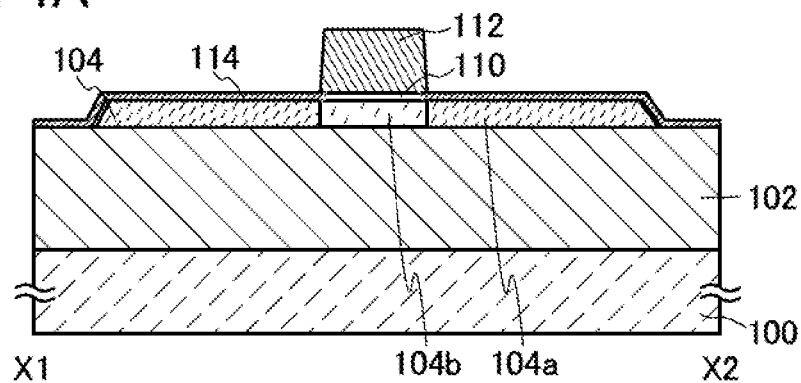
FIGS. 4A and 4B are cross-sectional views illustrating an example of a manufacturing process of a semiconductor element.

In this embodiment, the nitride regions 114 exist in part of the gate insulating film 110 in the film thickness direction; however, it is preferable that the nitride regions 114 exist in the entire thickness of the gate insulating film 110 in the film thickness direction as illustrated in FIG. 4A. With such a structure, even in the case where oxygen in the channel formation region 104b is eliminated upward (that is, in the direction of the gate insulating film 110), eliminated oxygen is not likely to be diffused in the plane direction because the nitride regions 114 are in contact with the gate insulating film 110.

The nitride regions 114 may be formed by the following method (nitriding treatment): a nitrogen gas, an ammonia gas, or the like is excited by high-frequency plasma to produce an active nitrogen radical (N radical) or a nitride hydrogen radical (NH radical), and the exposed portions of the gate insulating film 110 are nitrided using the radical. Further, in the nitriding treatment, heat treatment may be performed on the substrate.

The nitriding treatment using plasma can be performed using an apparatus including plasma generating system, such as a CVD apparatus, in particular, a high-density plasma CVD apparatus, or an etching apparatus.

Figure 3C:
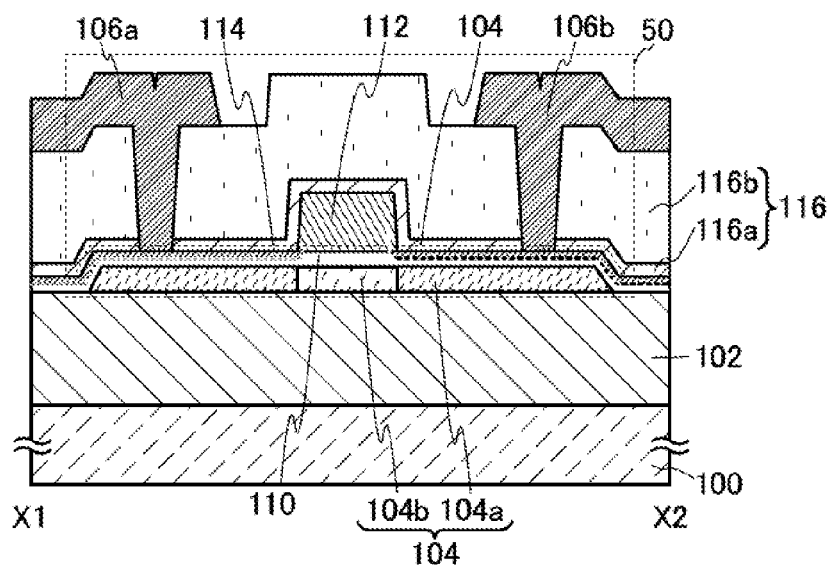

Next, the insulating film 116 including the first insulating film 116a and the second insulating film 116b is formed over the gate insulating film 110 and the gate electrode 112. Openings are formed in parts of the insulating film 116 so as to expose the conductive films 106a and 106b. Through the openings, the conductive films 106a and 106b which are electrically connected to the oxide semiconductor film 104 are formed (FIG. 3C). The conductive films 106a and 106b function as a source electrode (which can also be referred to as a source wiring) and a drain electrode (which can also be referred to as a drain wiring) of the semiconductor element 50.

For the first insulating film 116a and the second insulating film 116b, a method and a material similar to those for the base film 102 can be used. An insulating film closer to the oxide semiconductor film 104 (in this embodiment, the first insulating film 116a) is preferably formed to have a single-layer structure or a stacked-layer structure including a film with a high barrier property against oxygen, such as an aluminum oxide film, an aluminum oxynitride film, or an aluminum nitride oxide film.

In the case where the first insulating film 116a is formed using the above film with a high barrier property against oxygen, even if oxygen eliminated from the oxide semiconductor film 104 passes through the nitride regions 114, external release (which can also be referred to as external diffusion) of the eliminated oxygen can be effectively reduced.

In the case where an aluminum oxide film is used as the first insulating film 116a, the aluminum oxide film preferably has a high density (film density of higher than or equal to 3.2 g/cm$^3$, preferably higher than or equal to 3.6 g/cm$^3$).

The second insulating film 116b which is not directly in contact with the oxide semiconductor film 104 may be formed as follows: an organic resin such as an acrylic resin, a polyimide resin, a polyamide resin, a polyamide-imide resin, or an epoxy resin is applied by a spin-coating method, a printing method, a dispensing method, an ink-jet method, or the like, and cure treatment (e.g., heat treatment or light irradiation treatment) depending on the applied material is performed. In addition to such resin materials, it is also possible to use a low-dielectric constant material (low-k material), a siloxane-based resin, phosphosilicate glass (PSG), borophosphosilicate glass (BPSG), or the like.

In this embodiment, as the first insulating film 116a, a 70-nm-thick aluminum oxide film is formed using a sputtering apparatus (argon flow rate/oxygen flow rate: 25 sccm/25 sccm, pressure in a chamber: 0.4 Pa, applied power: 0.25 kW (RF), distance between a target and the substrate: 60 mm, and substrate temperature: 250° C.); as the second insulating film 116b, a 300-nm-thick silicon oxynitride film is formed using a CVD apparatus.

The method for forming the openings in parts of the insulating film 116, which expose the conductive films 106a and 106b, is not particularly limited, and a known method may be used (for example, a mask is formed over the insulating film 116 by a photolithography method, and part of the insulating film 116 is selectively removed using the mask by a dry etching method, a wet etching method, or the like).

The conductive films 106a and 106b can be formed as follows: a conductive film is formed by a physical vapor deposition method such as a vacuum evaporation method or a sputtering method, or a chemical vapor deposition method such as a plasma CVD method. A mask is formed over the conductive film by a photolithography method, a printing method, an ink-jet method, or the like. Then, part of the conductive film is selectively removed using the mask.

As a material of the conductive film, a material which is capable of withstanding heat treatment performed in the manufacturing process of the semiconductor element 50 is used. For example, a metal film containing an element selected from aluminum, chromium, copper, tantalum, titanium, molybdenum, and tungsten, or a metal nitride film containing any of the above elements as its component (e.g., a titanium nitride film, a molybdenum nitride film, or a tungsten nitride film) can be used. A structure may be employed in which a film of a high-melting-point metal such as titanium, molybdenum, or tungsten, or a nitride film of any of these metals (a titanium nitride film, a molybdenum nitride film, or a tungsten nitride film) is stacked either or both of over and under a metal film of aluminum, copper, or the like. Alternatively, the conductive film may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$; abbreviated to ITO), indium oxide-zinc oxide ($In_2O_3$—ZnO), or any of these metal oxide materials to which silicon oxide is added can be used.

In this embodiment, the conductive film is formed by stacking a 50-nm-thick titanium film, a 200-nm-thick aluminum film, and a 50-nm-thick titanium film in this order by a sputtering method. After that, a mask is formed over the conductive film by a photolithography method, and part of the conductive film is selectively removed by a dry etching method, a wet etching method, or the like. Accordingly, the conductive films 106a and 106b are formed.

Through the above steps, the top-gate semiconductor element 50 illustrated in FIGS. 1A and 1B, which can suppress generation of oxygen vacancies in the oxide semiconductor thin film, in particular, in the channel formation region, can be manufactured.

Figure 4B:
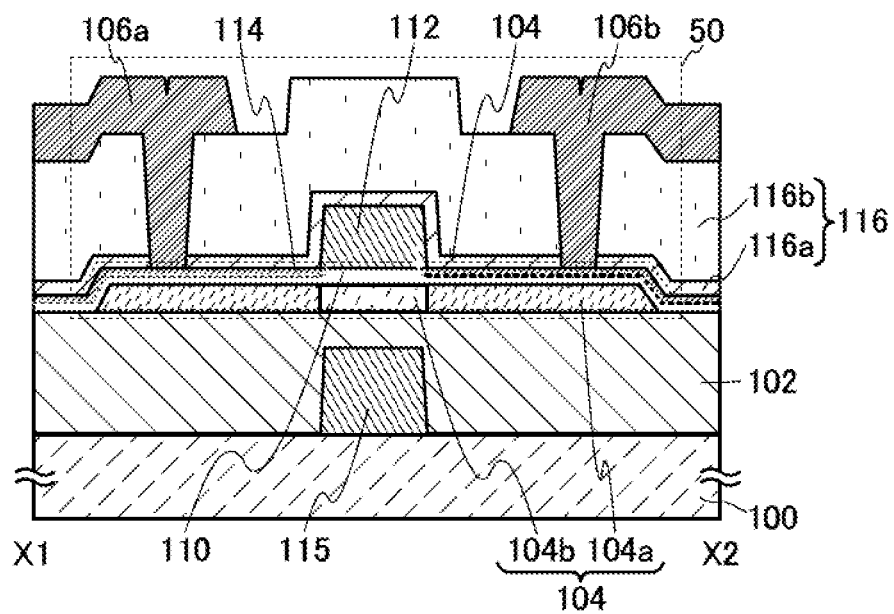

Note that the semiconductor element 50 may include a conductive film 115 functioning as a back gate of the semiconductor element 50 under the channel formation region 104b with the base film 102 positioned therebetween, as illustrated in FIG. 4B.

The conductive film 115 can have a function similar to that of the gate electrode 112 of the semiconductor element 50; thus, the threshold voltage of the semiconductor element 50 can be controlled by changing voltage applied to the conductive film 115. Accordingly, the semiconductor element 50 can be normally off, which is preferable.

The conductive film 115 may be formed using a method and a material similar to those for the gate electrode 112. Further, in the conductive film 115, at least a surface on the gate insulating film side is preferably formed using a material having a work function greater than the oxide semiconductor film 104, more preferably having a work function greater than the oxide semiconductor film 104 by 1 electron volt or more. As such a material for the conductive film 115, a material similar to that for the gate insulating film 110 can be used. For example, in the case of using an In—Ga—Zn—O film containing nitrogen, an In—Ga—Zn—O film having a nitrogen concentration higher than at least the oxide semiconductor film 104, specifically, an In—Ga—Zn—O film having a nitrogen concentration of 7 atomic % or higher may be used.

The methods and structures described in this embodiment can be combined as appropriate with any of the methods and structures described in the other embodiments.

Embodiment 2

In this embodiment, a structure of a top-gate semiconductor element which can suppress generation of oxygen vacancies in the oxide semiconductor thin film is described with reference to FIGS. 5A and 5B, and a manufacturing method of the semiconductor element is described with reference to FIGS. 6A to 6D and FIGS. 7A and 7B.

<Structural Example of Semiconductor Element>

The structure of the semiconductor element described in this embodiment is described with reference to FIGS. 5A and 5B. Note that FIG. 5A is a top view of a semiconductor element 150, and FIG. 5B is a cross-sectional view along dashed-dotted line A1-A2 in FIG. 5A.

The semiconductor element 150 described in this embodiment includes the same components as the semiconductor element 50 described in Embodiment 1. However, the structure of the semiconductor element 150 described in this embodiment is different from that of the semiconductor element 50 described in Embodiment 1 in that the nitride regions 114 are formed in side surfaces of the gate insulating film 110, and the nitride regions are formed also in parts of the top surface of the oxide semiconductor film 104 (hereinafter, the nitride regions in the oxide semiconductor film 104 are referred to as the nitride regions 111).

With the structure of the semiconductor element 50 described in Embodiment 1, in the case where the gate insulating film 110 which is not the nitride region 114 is in contact with the oxide semiconductor film 104 and extends in the plane direction of the oxide semiconductor film 104 as illustrated in FIG. 1B, oxygen eliminated from the channel formation region 104b tends to be diffused outside the semiconductor element 50 through the gate insulating film 110; thus, oxygen vacancies in the oxide semiconductor film 104 are increased, which causes an adverse effect on the semiconductor element 50 in some cases.

On the other hand, with the structure of the semiconductor element 150 described in this embodiment, the nitride regions 114 are formed in the side surfaces of the gate insulating film 110, diffusion of oxygen eliminated from the channel formation region 104b to the outside of the semiconductor element 150 can be suppressed. Therefore, an increase of oxygen vacancies in the oxide semiconductor film 104 can be suppressed and thus the electrical characteristics of the semiconductor element 150 can remain excellent.

Further, the oxide semiconductor film 104 is covered with the conductive films 106a and 106b, and the nitride regions 111 are formed in parts of the surface of the oxide semiconductor film 104 which are not covered with the conductive films 106a and 106b and the gate insulating film 110; accordingly, the oxide semiconductor film 104 has an effect for suppressing elimination of oxygen from the channel formation region through the oxide semiconductor film, and also an effect for suppressing diffusion of an impurity such as water or hydrogen from the outside to the channel formation region. Thus, the structure leads to an increase in reliability of the semiconductor element 150.

<Method for Manufacturing Semiconductor Element>

Figure 5A:
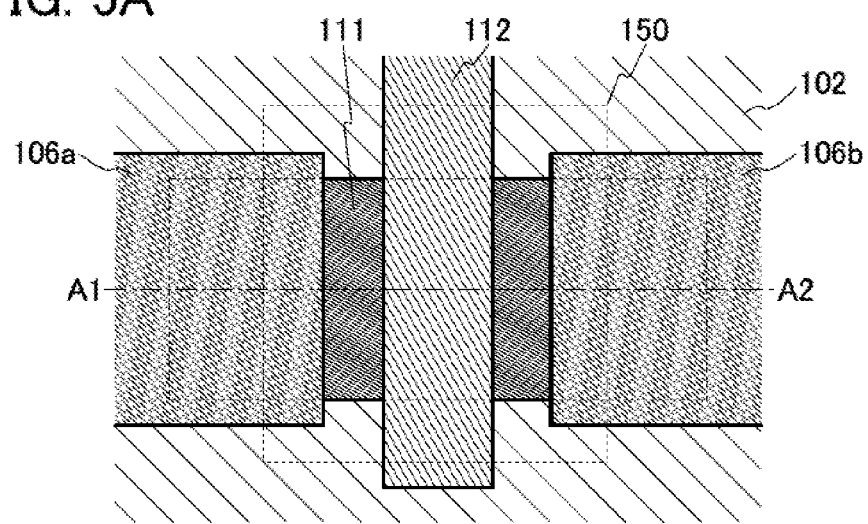
FIGS. 5A and 5B are a plan view and a cross-sectional view illustrating one embodiment of a semiconductor element.
Figure 5B:
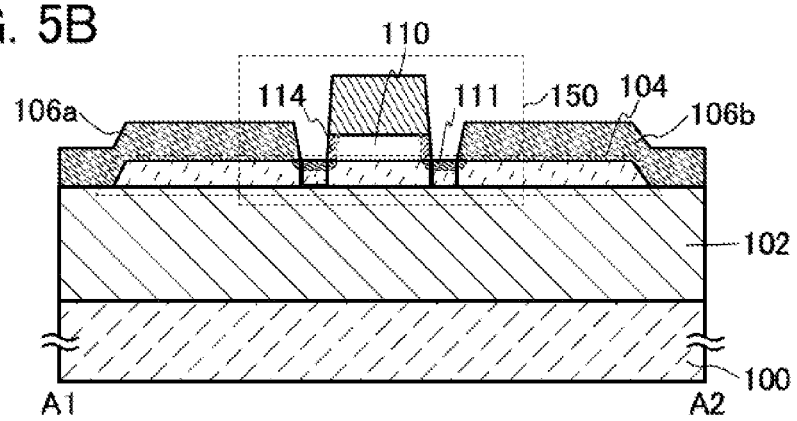

Next, a method for manufacturing the semiconductor element 150 illustrated in FIGS. 5A and 5B is described with reference to FIGS. 6A to 6D.

Figure 6A:
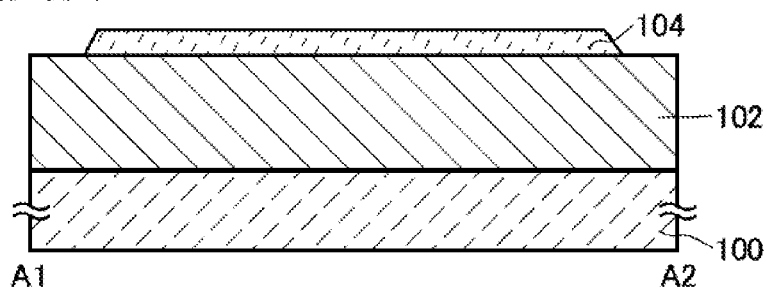
FIGS. 6A to 6D are cross-sectional views illustrating an example of a manufacturing process of a semiconductor element.

First, the base film 102 and the oxide semiconductor film 104 are formed over the substrate 100 having an insulating surface (see FIG. 6A). The substrate 100, the base film 102, and the oxide semiconductor film 104 may be formed using a material and a method similar to those for the substrate 100, the base film 102, and the oxide semiconductor film 104 described in Embodiment 1.

Figure 6B:
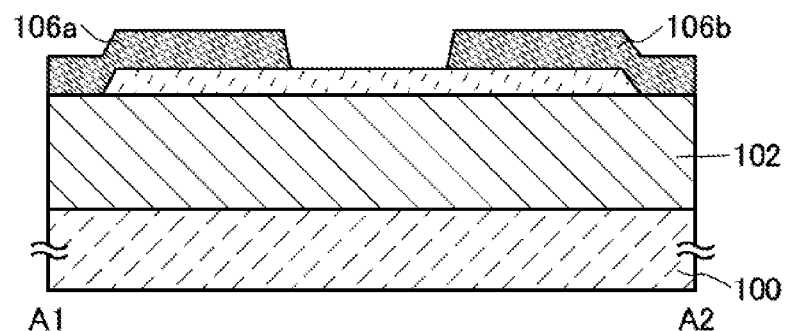
Figure 6C:
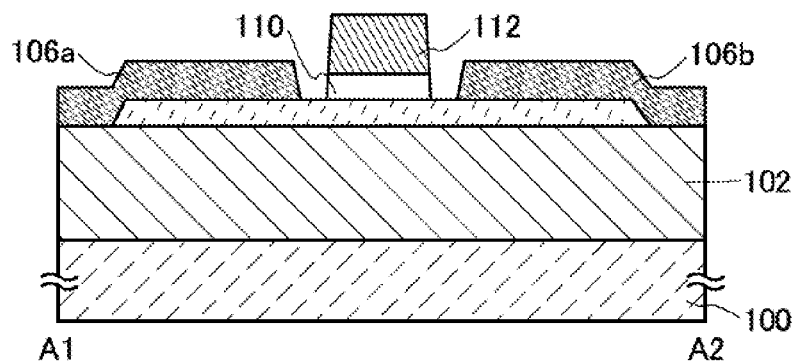
Figure 6D:
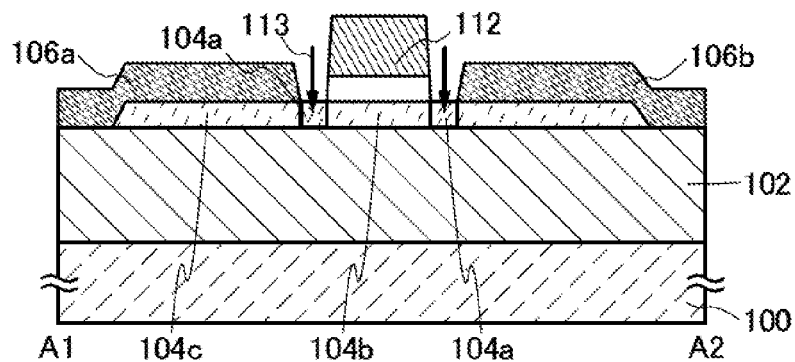

Next, a conductive film is formed over the base film 102 and the oxide semiconductor film 104, a mask is formed over the conductive film by a photolithography method, a printing method, an inkjet method, or the like, and part of the conductive film is selectively removed with the mask to be the conductive films 106a and 106b (see FIG. 6B). Note that the conductive films 106a and 106b are electrically connected to the oxide semiconductor film 104, and function as a source electrode (which can also be referred to as a source wiring) and a drain electrode (which can also be referred to as a drain wiring) of the semiconductor element 150.

Next, an insulating film and a conductive film are formed over the oxide semiconductor film 104 and the conductive films 106a and 106b. A mask is formed over the conductive film by a photolithography method, a printing method, an ink-jet method, or the like. Part of the conductive film and part of the insulating film are selectively removed using the mask. Accordingly, the gate insulating film 110 and the gate electrode 112 are formed (see FIG. 6C). The gate insulating film 110 and the gate electrode 112 may be formed using a material and a method similar to those for the gate insulating film 110 and the gate electrode 112 described in Embodiment 1.

Next, the impurity ions 113 which change the conductivity of the oxide semiconductor film 104 are added to the oxide semiconductor film 104. At this time, the gate electrode 112 functions as a mask and thus the low-resistance regions 104a which function as a source electrode and a drain electrode and to which the impurity ions 113 are added and the channel formation region 104b sandwiched between the pair of low-resistance regions 104a are formed in the oxide semiconductor film 104 in a self-aligning manner (see FIG. 6D). The impurity ions 113 are not added to regions of the oxide semiconductor film 104 overlapping with the conductive film 106a and the conductive film 106b. In order to distinguish the regions from the channel formation region 104b, the regions are referred to as offset regions 104c. For the impurity ions 113, a material and a method similar to those for the impurity ions 113 described in Embodiment 1 may be used.

Figure 7A:
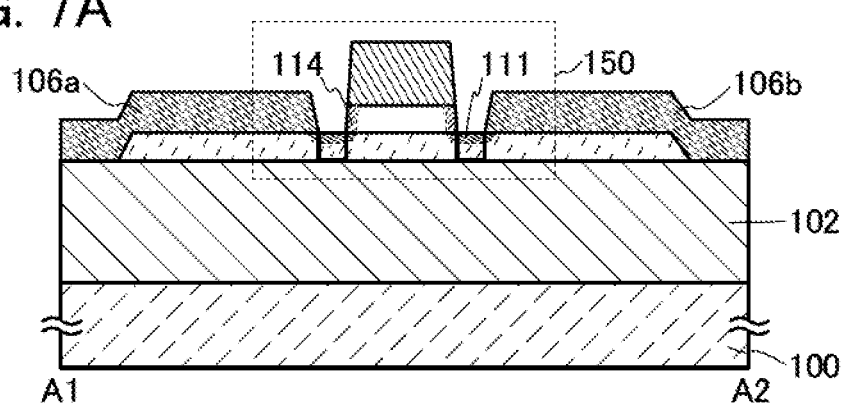
FIGS. 7A and 7B are cross-sectional views illustrating an example of a manufacturing process of a semiconductor element.

Next, nitriding treatment is performed on the exposed portions of the gate insulating film 110 and the oxide semiconductor film 104, so that the nitride regions 114 are formed in the side surfaces of the gate insulating film 110, and the nitride regions 111 are formed in parts of the top surface of the oxide semiconductor film 104, which are regions over which the gate insulating film 110 is not formed and regions in the vicinity thereof (see FIG. 7A). The nitride regions 111 and the nitride regions 114 may be formed using a method similar to that for the nitride regions 114 described in Embodiment 1.

Since the nitride regions 114 are formed in the side surfaces of the gate insulating film 110, release of oxygen in the channel formation region 104b to the outside with being diffused in the gate insulating film 110 in the plane direction can be suppressed.

Through the above steps, the top-gate semiconductor element 150 illustrated in FIGS. 5A and 5B can be manufactured.

Note that as described in Embodiment 2, the semiconductor element 150 may include a conductive film (not illustrated) functioning as a back gate of the semiconductor element 150 under the channel formation region 104b with the base film 102 positioned therebetween. The conductive film may be formed using a material and a method similar to those for the conductive film 115 described in Embodiment 1.

Since the semiconductor element 150 can suppress generation of oxygen vacancies in the oxide semiconductor thin film, in particular, in the channel formation region, in the electrical characteristics of the semiconductor element 150 can be excellent.

After that, as described in Embodiment 1 with reference to FIG. 3C, the insulating film 116 and a wiring 118 may be formed over the semiconductor element 150.

The methods and structures described in this embodiment can be combined as appropriate with any of the methods and structures described in the other embodiments.

Embodiment 3

In this embodiment, a structure of a top gate semiconductor element which is different from the structure in Embodiment 2 is described with reference to FIGS. 8A and 8B, and a method for manufacturing the semiconductor element is described with reference to FIGS. 9A to 9D.

<Structural Example of Semiconductor Element>

The structure of the semiconductor element described in this embodiment is described with reference to FIGS. 8A and 8B. Note that FIG. 8A is a top view of a semiconductor element 450, and FIG. 8B is a cross-sectional view along dashed-dotted line B1-B2 in FIG. 8A.

The semiconductor element 450 described in this embodiment includes the same components as the semiconductor element 150 described in Embodiment 2. However, the structure of the semiconductor element 450 described in this embodiment is different from that of the semiconductor element 150 described in Embodiment 2 in that the offset regions 104c do not exist in the oxide semiconductor film 104, and the nitride regions 111 are formed in regions of the top surface of the oxide semiconductor film 104 which overlap with the conductive films 106a and 106b.

In the structure of the semiconductor element 150 described in Embodiment 2, the conductive films 106a and 106b are directly in contact with the oxide semiconductor film 104. When a metal film is in contact with an oxide semiconductor film, a metal oxide film might be formed on a surface of the metal film which is in contact with the oxide semiconductor film by heat treatment or the like, so that the contact resistance might be increased. Accordingly, in the semiconductor element, changes in electrical characteristics might be caused, such as a reduction in on-state current (current flowing between a source and a drain in the state where a semiconductor element is in an on state) of the semiconductor element or variation in threshold voltage.

On the other hand, with the structure of the semiconductor element 450 described in this embodiment, since the nitride regions 111 exist in the surfaces of the oxide semiconductor film 104 which are in contact with the conductive films 106a and 106b, the contact resistance between the oxide semiconductor film 104 and the conductive films 106a and 106b can be reduced; thus, the electrical characteristics of the semiconductor element 450 can remain excellent.

Further, the nitride regions 111 can suppress release of oxygen in the oxide semiconductor film 104 to the outside and diffusion of an impurity such as water or hydrogen from the outside to the channel formation region, so that reliability of the semiconductor element 450 can be increased.

<Method for Manufacturing Semiconductor Element>

Figure 8A:
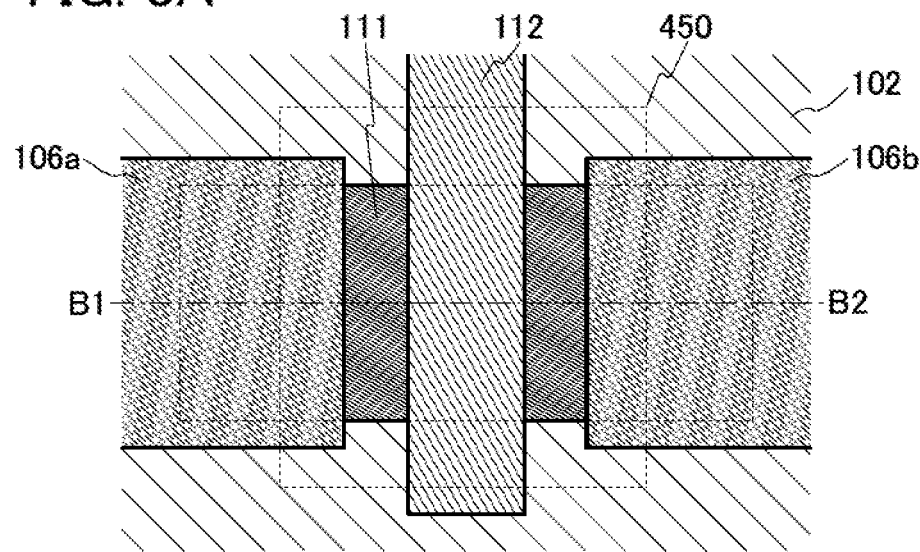
FIGS. 8A and 8B are a plan view and a cross-sectional view illustrating one embodiment of a semiconductor element.
Figure 8B:
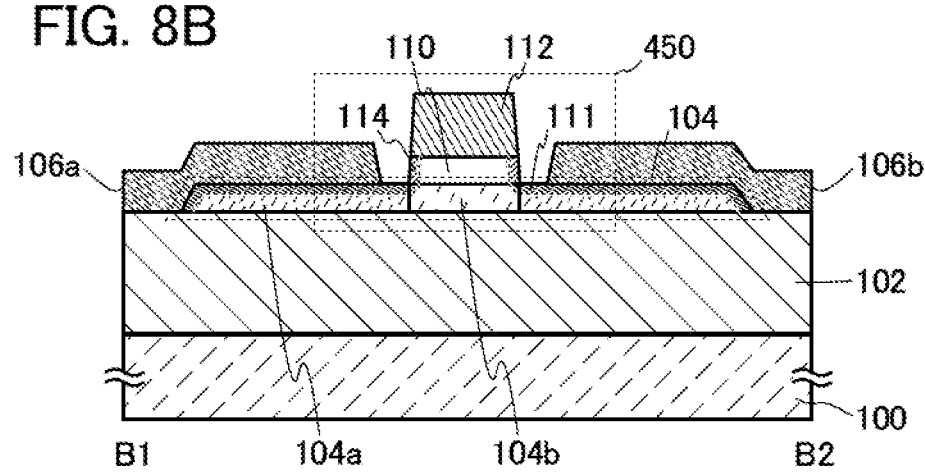

Next, a method for manufacturing the semiconductor element 450 illustrated in FIGS. 8A and 8B is described with reference to FIGS. 9A to 9D.

Figure 9A:
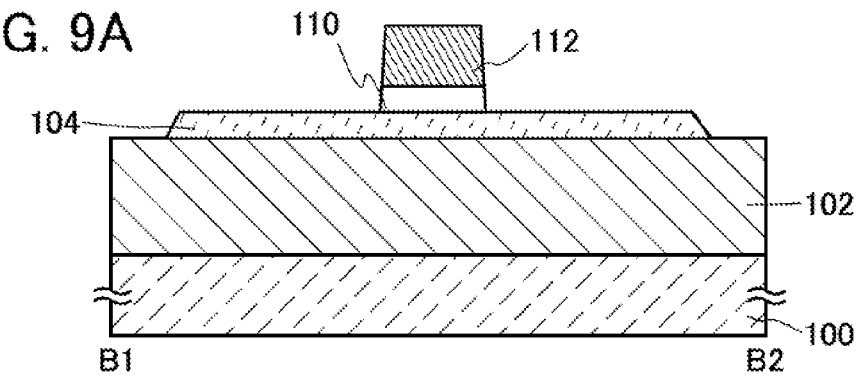
FIGS. 9A to 9D are cross-sectional views illustrating an example of a manufacturing process of a semiconductor element.
Figure 9B:
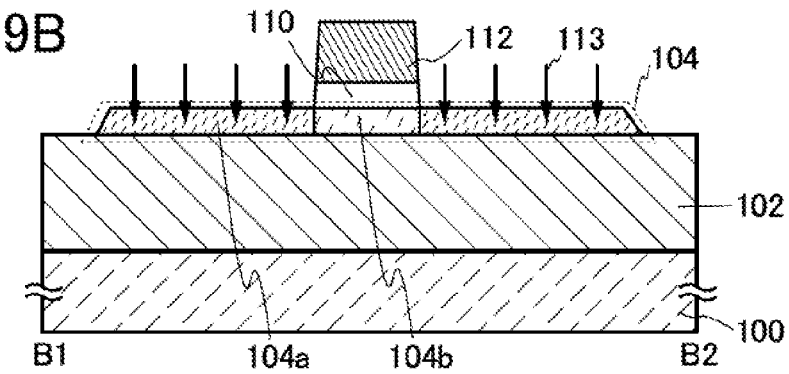

First, the base film 102, the oxide semiconductor film 104, the gate insulating film 110, and the gate electrode 112 are formed over the substrate 100 having an insulating surface (see FIG. 9A). The substrate 100, the base film 102, the oxide semiconductor film 104, the gate insulating film 110, and the gate electrode 112 may be formed using a material and a method similar to those for the substrate 100, the base film 102, the oxide semiconductor film 104, the gate insulating film 110, and the gate electrode 112 described in Embodiment 2. As described in Embodiment 2, the gate insulating film 110 may have a stacked-layer structure at least including a first insulating film and a second insulating film. The first insulating film contains silicon oxide or aluminum oxide as its main component. The second insulating film is positioned over the first insulating film and has a higher dielectric constant than the first insulating film.

Next, the impurity ions 113 which change the conductivity of the oxide semiconductor film 104 are added to the oxide semiconductor film 104. At this time, the gate electrode 112 functions as a mask and thus the low-resistance regions 104a to which the impurity ions 113 are added and the channel formation region 104b sandwiched between the pair of low-resistance regions 104a are formed in the oxide semiconductor film 104 in a self-aligning manner (see FIG. 9B). The impurity ions 113 may be formed using a material and a method similar to those for the impurity ions 113 described in Embodiment 2.

Figure 9C:
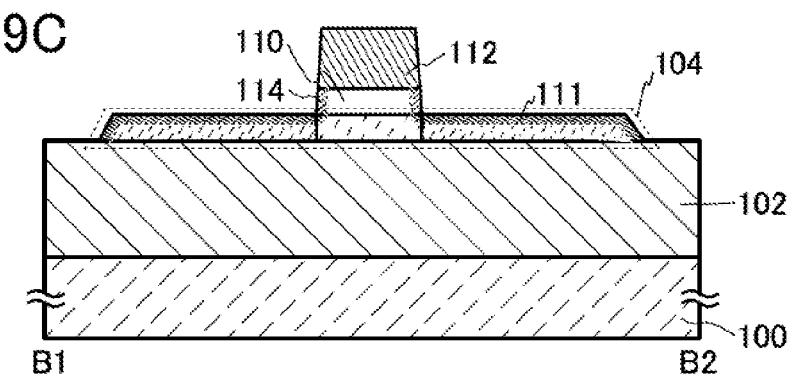

Next, nitriding treatment is performed on the exposed portions of the gate insulating film 110 and the oxide semiconductor film 104, so that the nitride regions 114 are formed in at least the side surfaces of the gate insulating film 110, and the nitride regions 111 are formed in regions of the surface of the oxide semiconductor film 104 over which the gate insulating film 110 is not formed (see FIG. 9C). The nitride regions 111 and the nitride regions 114 may be formed using a method similar to that described in Embodiment 2.

Figure 9D:
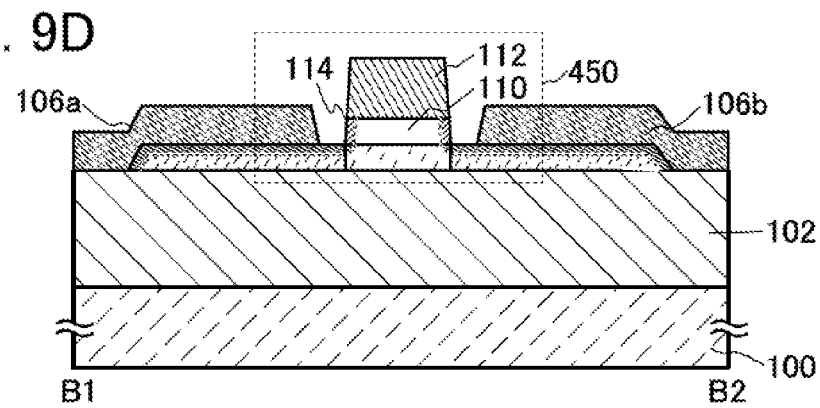

Next, the conductive films 106a and 106b are formed to be in contact with the low-resistance regions 104a in the oxide semiconductor film 104 (see FIG. 9D). The conductive films 106a and 106b may be formed using a material and a method similar to those for the conductive films 106a and 106b described in Embodiment 2.

Through the above steps, the top-gate semiconductor element 450 illustrated in FIGS. 8A and 8B can be manufactured.

As described in Embodiment 2, the semiconductor element 450 may include a conductive film (not illustrated) functioning as a back gate of the semiconductor element 450 under the channel formation region 104b with the base film 102 positioned therebetween. The conductive film may be formed using a material and a method similar to those for the conductive film 115 described in Embodiment 2.

As well as being able to suppress generation of oxygen vacancies in the oxide semiconductor thin film, in particular, in the channel formation region, the semiconductor element 450 can reduce the contact resistance between the oxide semiconductor film 104 and the conductive films 106a and 106b, suppress elimination of oxygen from the channel formation region through the oxide semiconductor film, suppress diffusion of an impurity such as water or hydrogen from the outside to the channel formation region, and reduce the resistance between the conductive films 106a and 106b. Thus, the electrical characteristics of the semiconductor element 450 can be excellent.

Figure 7B:
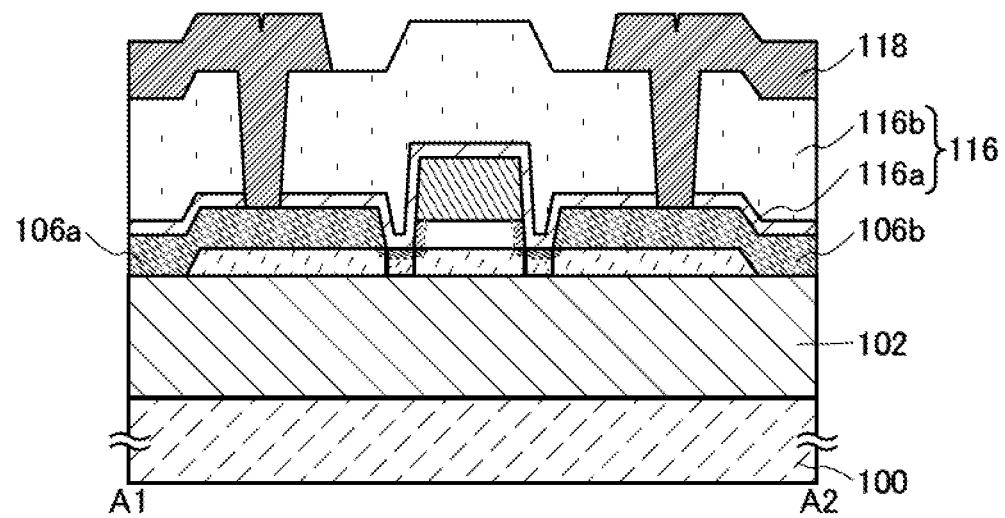

After that, as described in Embodiment 2 with reference to FIG. 7B, the insulating film 116 and the wiring 118 may be formed over the semiconductor element 450.

The methods and structures described in this embodiment can be combined as appropriate with any of the methods and structures described in the other embodiments.

Embodiment 4

In this embodiment, a structure of a top gate semiconductor element which is different from the structure in the above embodiments is described with reference to FIGS. 10A and 10B, and a method for manufacturing the semiconductor element is described with reference to FIGS. 11A to 11D.

<Structural Example of Semiconductor Element>

The structure of the semiconductor element described in this embodiment is described with reference to FIGS. 10A and 10B. Note that FIG. 10A is a top view of a semiconductor element 650, and FIG. 10B is a cross-sectional view along dashed-dotted line C1-C2 in FIG. 10A.

The semiconductor element 650 described in this embodiment is different from the semiconductor element described in Embodiment 2 in that the nitride regions 111 which are formed by performing nitriding treatment on the oxide semiconductor film 104 do not exist.

In the case where the nitride regions 111 are formed in the top surface of the oxide semiconductor film 104 as in the semiconductor element described in the above-described embodiment, elimination of oxygen from the oxide semiconductor film 104 can be suppressed, impurity diffusion to the oxide semiconductor film 104 can be suppressed, and the contact resistance between the oxide semiconductor film 104 and the conductive film 106a (or the conductive film 106b) can be reduced, for example. As illustrated in FIG. 1B and FIG. 8B, the nitride regions 111 are formed not only in a vicinity of a surface of an exposed region in the oxide semiconductor film 104 but also in a vicinity of a surface of a region overlapping with the gate insulating film 110, that is, the channel formation region 104b in some cases.

As described above, in the case where the nitride regions 111 are formed in the channel formation region 104b, the resistance of the channel formation region 104b (especially in a vicinity of a top surface of the channel formation region 104b) is lowered and thus an actual channel length and a designed channel length of the semiconductor element are different from each other, which might cause a problem in that electrical characteristics assumed by a practitioner cannot be obtained.

In particular, in the case where the channel length of the semiconductor element is extremely small (e.g., 30 nm or smaller), the nitride region 111 is formed in the entire length of the channel formation region 104b in the channel length direction, so that the electrical characteristics of the semiconductor element cannot be obtained (for example, a sufficient on/off ratio which allows the semiconductor element to function cannot be obtained due to large leakage current) in some cases.

On the other hand, with the structure of the semiconductor element 650 described in this embodiment, a nitride region does not exist in the top surface of the oxide semiconductor film 104; thus, the above problem can be prevented.

<Method for Manufacturing Semiconductor Element>

Figure 10A:
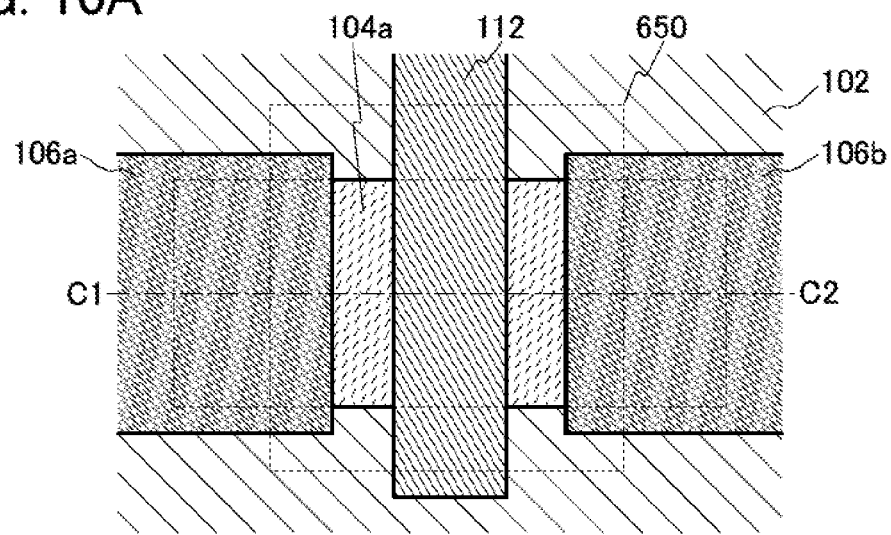
FIGS. 10A and 10B are a plan view and a cross-sectional view illustrating one embodiment of a semiconductor element.
Figure 10B:
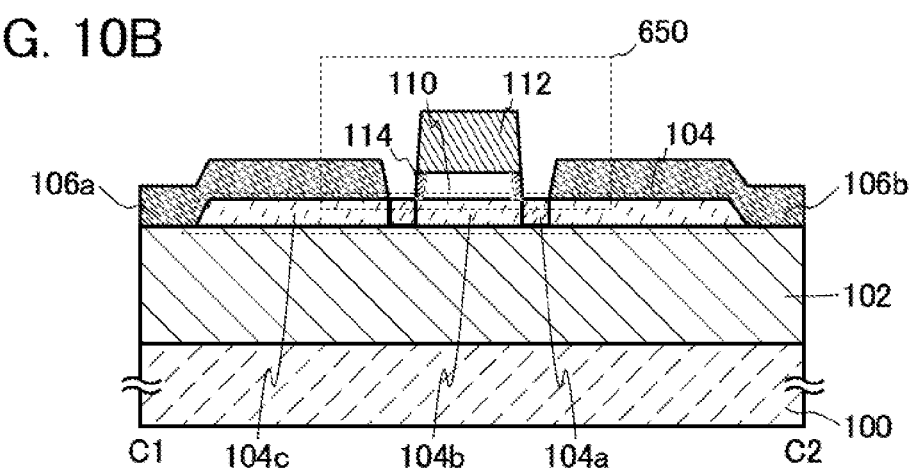

Next, an example of a method for manufacturing the semiconductor element 650 illustrated in FIGS. 10A and 10B is described with reference to FIGS. 11A to 11D.

Figure 11A:
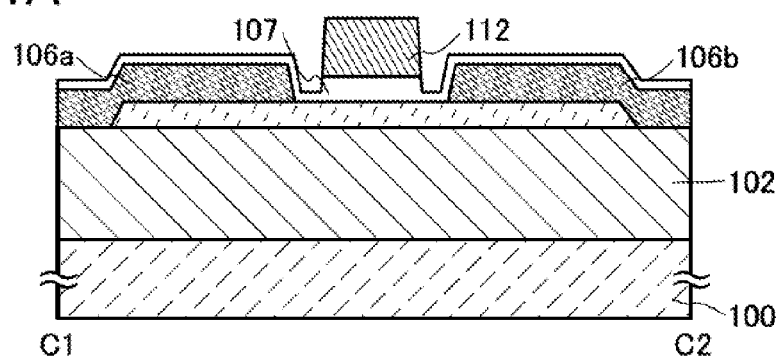
FIGS. 11A to 11D are cross-sectional views illustrating an example of a manufacturing process of a semiconductor element.
Figure 11B:
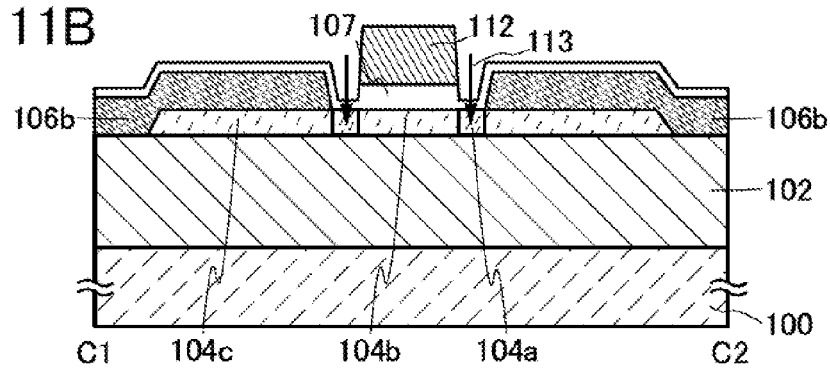

First, the base film 102, the oxide semiconductor film 104, the conductive films 106a and 106b, an insulating film 107, and the gate electrode 112 are formed over the substrate 100 having an insulating surface (see FIG. 11A). The substrate 100, the base film 102, the oxide semiconductor film 104, the conductive films 106a and 106b, the insulating film 107, and the gate electrode 112 may be formed using a material and a method similar to those for the substrate 100, the base film 102, the oxide semiconductor film 104, the conductive films 106a and 106b, the insulating film 107, and the gate electrode 112 described in Embodiment 2.

The insulating film 107 can be formed using a material and a method similar to those for the gate insulating film 110 described in Embodiment 2; in the formation, removing treatment is stopped before regions which do not overlap with the gate electrode 112 are completely removed. At this time, the thickness of the insulating film 107 in the regions which do not overlap with the gate electrode 112 is preferably greater than the entire thickness of the insulating film 107 nitrided by later nitriding treatment in the film thickness direction. The thickness may be set as appropriate by a practitioner in consideration of a film quality of the insulating film 107 or a method of the nitriding treatment.

Next, the impurity ions 113 which change the conductivity of the oxide semiconductor film 104 are added to the oxide semiconductor film 104. At this time, the conductive films 106a and 106b and the gate electrode 112 function as masks, and thus the low-resistance regions 104a which function as a source region and a drain region and to which the impurity ions 113 are added, the channel formation region 104b sandwiched between the pair of low-resistance regions 104a, and the offset regions 104c are formed in the oxide semiconductor film 104 in a self-aligning manner (see FIG. 11B). The impurity ions 113 may be formed using a material and a method similar to those for the impurity ions 113 described in the above embodiments.

The impurity ions 113 are added to the oxide semiconductor film 104 through the insulating film 107 and thus the oxide semiconductor film 104 is not directly damaged in the ion addition, which is advantageous in that the crystallinity of the oxide semiconductor film 104 is not likely to be disordered.

Figure 11C:
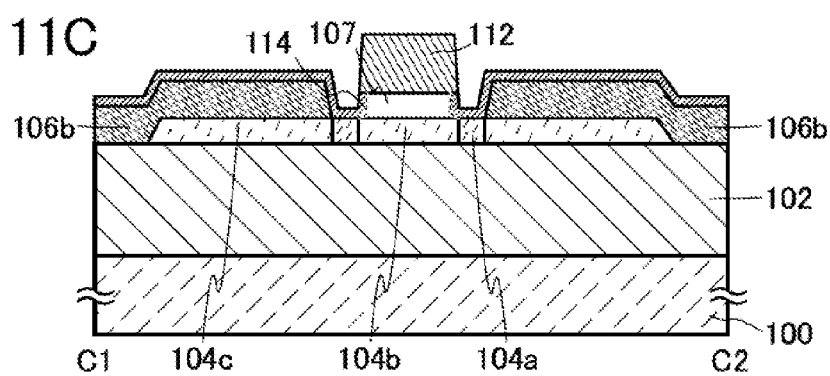

Next, the nitriding treatment is performed on the exposed portions of the insulating film 107, so that the nitride regions 114 are formed in parts of the insulating film 107 (see FIG. 11C). The nitride regions 114 may be formed using a method similar to that described in Embodiment 2.

Figure 11D:
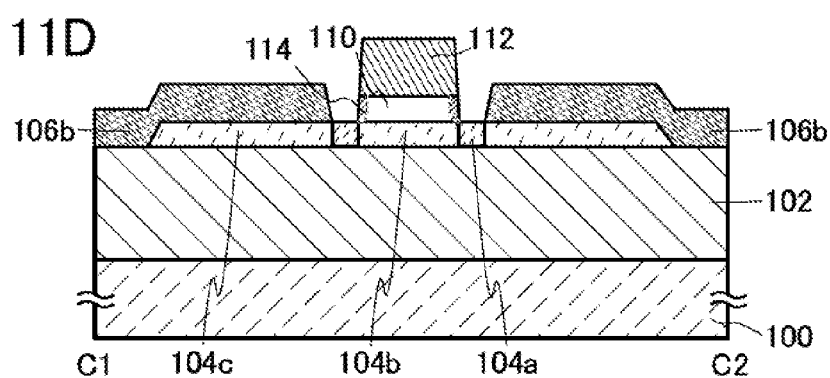

Next, regions of the insulating film 107 which do not overlap with the gate electrode 112 are removed, so that the gate insulating film 110 is formed (see FIG. 11D). The insulating film 107 may be removed by the method used for forming the gate insulating film 110 described in the above embodiments. As described in Embodiment 1, the gate insulating film 110 may have a stacked-layer structure at least including a first insulating film and a second insulating film. The first insulating film contains silicon oxide or aluminum oxide as its main component. The second insulating film is positioned over the first insulating film and has a higher dielectric constant than the first insulating film.

Although the regions in the insulating film 107 which do not overlap with the gate electrode 112 are entirely removed in this embodiment, the insulating film 107 is not necessarily entirely removed. The insulating film 107 may remain with a small thickness over the oxide semiconductor film 104 or the conductive film 106a (or the conductive film 106b).

Through the above steps, the top-gate semiconductor element 650 illustrated in FIGS. 10A and 10B can be manufactured.

As described in Embodiment 2, the semiconductor element 650 may include a conductive film (not illustrated) functioning as a back gate of the semiconductor element 650 under the channel formation region 104b with the base film 102 positioned therebetween. The conductive film may be formed using a material and a method similar to those for the conductive film 115 described in Embodiment 2.

After that, as illustrated in FIG. 7B described in Embodiment 2, the insulating film 116 and the wiring 118 may be formed over the semiconductor element 650.

The methods and structures described in this embodiment can be combined as appropriate with any of the methods and structures described in the other embodiments.

Embodiment 5

In this embodiment, an example of a semiconductor device which includes the semiconductor element described in any of Embodiments 2 to 4, which can hold stored data even during a period in which power is not supplied, and which does not have a limitation on the number of writing cycles, is described with reference to drawings.

Figure 12A:
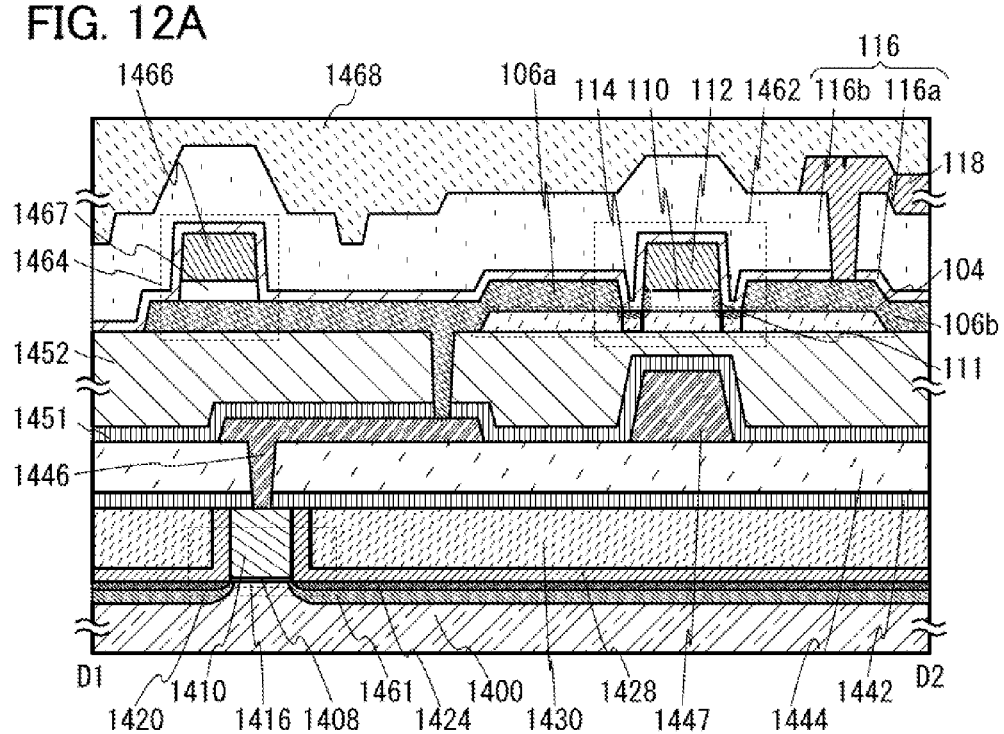
FIGS. 12A to 12C illustrate an example of a structure of a semiconductor device.
Figure 12B:
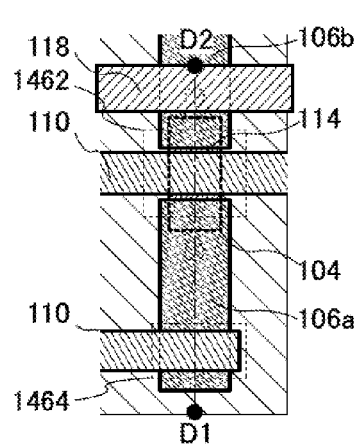
Figure 12C:
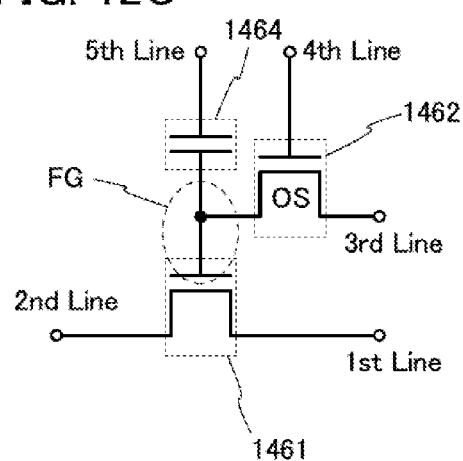

FIGS. 12A to 12C illustrate an example of a structure of a semiconductor device. FIGS. 12A to 12C illustrate a cross-sectional view, a plan view, and a circuit diagram, respectively, of the semiconductor device. Here, FIG. 12A corresponds to a cross section taken along line D1-D2 in FIG. 12B.

The semiconductor device illustrated in FIGS. 12A and 12B includes a transistor 1461 including a first semiconductor material in a lower layer, a transistor 1462 including a second semiconductor material in an upper layer, and a capacitor 1464. In this embodiment, any of the structures of the transistors described in the above embodiments can be employed for the transistor 1462. Here, description is made on the case where the semiconductor element 150 described in Embodiment 2 is used.

Here, the first semiconductor material and the second semiconductor material are preferably materials having different band gaps. For example, the second semiconductor material may be a semiconductor material other than an oxide semiconductor (e.g., a silicon-based semiconductor material and a compound-based semiconductor material) and the first semiconductor material may be an oxide semiconductor. Further preferably, the second semiconductor material is a single crystal semiconductor material. A transistor including a material other than an oxide semiconductor can operate at high speed easily. On the other hand, a transistor including an oxide semiconductor enables charge to be held for a long time owing to its characteristics.

Although all the transistors are n-channel transistors here, it is needless to say that p-channel transistors can also be used. The specific constituent of the semiconductor device is not necessarily limited to those described here such as the material used for the semiconductor device and the structure of the semiconductor device.

The transistor 1461 in FIG. 12A includes a channel formation region 1416 provided in a substrate 1400 containing a semiconductor material other than an oxide semiconductor (for example, silicon, germanium, or a compound semiconductor material such as GaAs, InP, SiC, ZnSe, GaN, or SiGe, can be used), impurity regions 1420 between which the channel formation region 1416 is provided, intermetallic compound regions 1424 in contact with the impurity regions 1420, a gate insulating film 1408 provided over the channel formation region 1416, and a gate electrode 1410 provided over the gate insulating film 1408. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the "source electrode" may include a source region.

An insulating film 1428 and an insulating film 1430 are provided so as to cover a transistor 1461 over the substrate 1400. Note that in the transistor 1461, sidewall insulating films may be formed on a side surface of the gate electrode 1410, and the impurity regions 1420 may include regions having different impurity concentrations.

The transistor 1461 including a single crystal semiconductor material (e.g., a single crystal silicon substrate) can operate at high speed. Thus, when the transistor is used as a reading transistor, data can be read at a high speed. The insulating films 1428 and 1430 are formed so as to cover the transistor 1461. Then, treatment for exposing a top surface of the gate electrode 1410 is performed so that the transistor 1461 is electrically connected to the transistor 1462 in the upper layer. For the treatment, a method similar to that used in the removal treatment described in the above embodiments may be used.

As the insulating film 1428 and the insulating film 1430, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be typically used. The insulating film 1428 and the insulating film 1430 can be formed by a plasma CVD method, a sputtering method, or the like.

The insulating films 1428 and 1430 may be formed as follows: an organic resin such as an acrylic resin, a polyimide resin, a polyamide resin, a polyamide-imide resin, or an epoxy resin is applied by a spin-coating method, a printing method, a dispensing method, an ink-jet method, or the like, and cure treatment (e.g., heat treatment or light irradiation treatment) depending on the applied material is performed. In addition to such resin materials, it is also possible to use a low-dielectric constant material (low-k material), a siloxane-based resin, phosphosilicate glass (PSG), borophosphosilicate glass (BPSG), or the like.

Note that in this embodiment, a silicon nitride film is used as the insulating film 1428, and a silicon oxide film is used as the insulating film 1430.

Insulating films 1442 and 1444 are provided over the insulating films 1428 and 1430 which are sufficiently planarized by planarization treatment such as CMP treatment (the average plane roughness of surfaces of the insulating films 1428 and 1430 is preferably 0.15 nm or less). The insulating films 1442 and 1444 may be formed using a method and a material similar to those for the insulating film 1428.

A wiring 1446 electrically connected to the gate electrode 1410 is formed over the insulating film 1444 through an opening formed in the insulating films 1442 and 1444. The wiring 1446 may be formed using a method and a material similar to those for the conductive films 106a and 106b in the above embodiments.

A conductive film 1447 functioning as a back gate of the transistor 1462 in the upper layer may be formed in the same step as the formation of the wiring 1446. The conductive film 1447 can function in a manner similar to that of the gate electrode of the transistor 1462; thus, the threshold voltage of the transistor 1462 can be controlled by changing voltage applied to the conductive film 1447. Accordingly, the transistor 1462 can be normally off.

By providing the conductive film 1447 below the transistor 1462, transfer of an impurity, which might affect characteristics of the transistor 1462, from the lower layer in which the first transistor 1461 is provided to the upper layer in which the second transistor 1462 is provided is suppressed. As the impurity, hydrogen (including water, a hydrogen ion, a hydroxide ion, or the like) or the like can be given.

In order to make the transistor 1462 normally off, it is preferable that a material used at least for a surface of the conductive film 1447 (a surface on the transistor 1462 side) have a work function greater than that of the oxide semiconductor film 104; it is more preferable that the material have a work function greater than that of the oxide semiconductor film 104 by 1 eV or more. For example, in the case where an IGZO film is used as the oxide semiconductor film 104 as described in the above embodiments, an oxynitride film (hereinafter, referred to as an IGZON film in some cases) containing indium, gallium, and zinc, which has a work function greater than the IGZO film, can be used.

Further, an insulating film 1451 is provided over the wiring 1446 and the conductive film 1447 so as to suppress transfer of an impurity, which might affect characteristics of the transistor, from the lower layer in which the first transistor 1461 is provided to the upper layer in which the second transistor 1462 is provided.

As the insulating film 1451, an aluminum oxide film, an aluminum nitride film, an aluminum oxynitride film, an aluminum nitride oxide film, or the like may be formed by a physical vapor deposition method such as a vacuum evaporation method or a sputtering method, or a chemical vapor deposition method such as a plasma CVD method, for example.

A base film 1452 is formed over the insulating film 1451 so as to planarize an uneven portion resulting from formation of the wiring 1446 or the conductive film 1447, to make it easier to form the transistor 1462 and the capacitor 1464, and to supply oxygen to the oxide semiconductor film 104 included in the transistor 1462. The base film 1452 may be formed using a material similar to that for the base film 102 and subjected to planarizing treatment using a CMP apparatus.

The transistor 1462 and the capacitor 1464 are formed over the base film 1452. One electrode of a pair of electrodes of the capacitor 1464 is formed using the same material and step as the conductive films 106a and 106b of the transistor 1462. An electrode 1466, which is the other electrode of the pair of electrodes, is formed using the same material and step as the gate electrode 112 of the transistor 1462. A dielectric film 1467 is formed using the same material and step as the gate insulating film 110 of the transistor 1462. Note that the detailed description of each component of the transistor 1462 is omitted because the transistor 1462 is similar to the semiconductor element 150 described in the above embodiments.

The transistor 1462 illustrated in FIG. 12A includes an oxide semiconductor material in the channel formation region. Here, the oxide semiconductor film 104 included in the transistor 1462 is preferably highly purified by removing an impurity such as moisture or hydrogen as much as possible, as described in the above embodiment. Further, the oxide semiconductor film in which oxygen vacancies are sufficiently compensated is preferable. By use of such an oxide semiconductor film, the off-state current can be extremely small.

The off-state current of the transistor 1462 is extremely small, which makes it possible to hold stored data for a long time. In other words, refresh operation becomes unnecessary or the frequency of the refresh operation in the semiconductor device can be extremely lowered, which leads to a sufficient reduction in power consumption.

The wiring 118 is formed over the transistor 1462 and the capacitor 1464 through an opening formed in the insulating films 116a and 116b so as to be electrically connected to the conductive film 106b.

An insulating film 1468 for planarization is provided over the insulating film 116 and the wiring 118. The insulating film 1468 can be formed using the organic resin referred to in the description of the insulating films 1428 and 1430.

In FIGS. 12A and 12B, the transistor 1461 is provided so as to overlap with at least part of the transistor 1462. The source region or the drain region of the transistor 1461 and the oxide semiconductor film 104 are preferably provided so as to overlap with each other at least partly. Further, one or both of the transistor 1462 and the capacitor 1464 are preferably provided so as to overlap with the transistor 1461. For example, the one electrode and the other electrode 1466 of the capacitor 1464 are provided so as to overlap with the transistor 1461 at least partly. With such a planar layout, the area occupied by the semiconductor device can be reduced; thus, higher integration can be achieved.

Next, an example of a circuit configuration corresponding to FIGS. 12A and 12B is illustrated in FIG. 12C.

In FIG. 12C, a first wiring (a 1st line) is electrically connected to the source electrode of the transistor 1461, and a second wiring (a 2nd line) is electrically connected to the drain electrode of the transistor 1461. A third wiring (a 3rd line) is electrically connected to the source electrode (or the drain electrode) of the transistor 1462, and a fourth wiring (a 4th line) is electrically connected to the gate electrode of the transistor 1462. The gate electrode of the transistor 1461 and the drain electrode (or the source electrode) of the transistor 1462 are electrically connected to the other electrode of the capacitor 1464, and a fifth wiring (a 5th line) is electrically connected to the one electrode of the capacitor 1464.

The semiconductor device in FIG. 12C can write, hold, and read data as described below, utilizing a characteristic in which the potential of the gate electrode of the transistor 1461 can be held. Since an oxide semiconductor of the transistor 1461 is formed using an oxide semiconductor (OS) as its active layer (which can also be referred to as a channel formation region), which is indicated by "OS" beside the circuit symbol of this transistor. A transistor indicated by "OS" in another drawing of this specification has a meaning which is similar to the transistor described above.

Writing and holding of data are described. First, the potential of the fourth wiring is set to a potential at which the transistor 1462 is turned on, so that the transistor 1462 is turned on. Accordingly, the potential of the third wiring is supplied to the gate electrode of the transistor 1461 and the capacitor 1464. In other words, a predetermined charge is supplied to the gate electrode of the transistor 1461 (writing). Here, charge for supply of a potential level or charge for supply of a different potential level (hereinafter referred to as Low-level charge and High-level charge) is given. After that, the potential of the fourth wiring is set to a potential at which the transistor 1462 is off, so that the transistor 1462 is turned off. Thus, the charge supplied to the gate electrode of the transistor 1461 is held (holding).

Since the off-state current of the transistor 1462 is extremely low, the charge of the gate electrode of the transistor 1461 is held for a long time.

Next, reading of data is described. When an appropriate potential (reading potential) is supplied to the fifth wiring with a predetermined potential (constant potential) supplied to the first wiring, the potential of the second wiring varies depending on the amount of charge held in the gate electrode of the transistor 1461. This is because in general, when the transistor 1461 is an n-channel transistor, an apparent threshold voltage $V_{th\_H}$ in the case where High-level charge is supplied to the gate electrode of the transistor 1461 is lower than an apparent threshold voltage $V_{th\_L}$ in the case where Low-level charge is supplied to the gate electrode of the transistor 1461. Here, the apparent threshold voltage refers to the potential of the fifth wiring which is needed to turn on the transistor 1461. Thus, the potential of the fifth wiring is set to a potential $V_0$ that is between $V_{th\_H}$ and $V_{th\_L}$, whereby charge applied to the gate electrode of the transistor 1461 can be determined. For example, in the case where High-level charge is supplied at the time of writing, when the potential of the fifth wiring is $V_0$ ($>V_{th\_H}$), the transistor 1461 is turned on. In the case where Low-level electric charge is supplied at the time of writing, even when the potential of the fifth wiring is $V_0$ ($<V_{th\_L}$), the transistor 1461 remains in an off state. Therefore, the stored data can be read by measuring the potential of the second wiring.

Note that in the case where memory cells are arrayed to be used, only data of desired memory cells needs to be read. In the case where such reading is not performed, a potential at which the transistor 1461 is turned off regardless of the state of the gate electrode of the transistor 1461, that is, a potential smaller than $V_{th\_H}$ may be supplied to the fifth wiring. Alternatively, a potential at which the transistor 1461 is turned on, that is, a potential higher than $V_{th\_L}$ may be supplied to the fifth wiring regardless of the state of the gate electrode of the transistor 1461.

By applying a transistor having a channel formation region formed using an oxide semiconductor and having extremely small off-state current to the semiconductor device in this embodiment, the semiconductor device can store data for an extremely long time. In other words, refresh operation becomes unnecessary or the frequency of the refresh operation can be extremely lowered, which leads to a sufficient reduction in power consumption. Moreover, stored data can be held for a long time even when power is not supplied (note that a potential is preferably fixed).

Further, in the semiconductor device described in this embodiment, a high voltage is not needed for writing data and there is no problem of deterioration of elements. For example, unlike in the case of a conventional non-volatile memory, it is not necessary to inject and extract electrons into and from a floating gate; thus, the problem of deterioration of a gate insulating film does not occur. In other words, the semiconductor device according to one embodiment of the present invention does not have a limit on the number of writing cycles which is a problem in a conventional nonvolatile memory, and reliability thereof is drastically improved. Furthermore, data is written depending on the on state and the off state of the transistor, whereby high-speed operation can be easily achieved.

As described above, a miniaturized and highly-integrated semiconductor device having high electrical characteristics and a method for manufacturing the semiconductor device can be provided.

Note that the transistor 1461 in this embodiment is formed using a substrate including a semiconductor material (e.g., a silicon substrate, a germanium substrate, or a substrate including a compound semiconductor material); however, the transistor 1461 may be formed using a thin film obtained by separation of part of a single crystal semiconductor substrate or a compound semiconductor substrate. A known method for manufacturing an SOI substrate can be referred to for a method for forming a single crystal semiconductor thin film or a compound semiconductor thin film by separation of part of a single crystal semiconductor substrate or a compound semiconductor substrate (e.g., Japanese Published Patent Application No. 2010-109345).

The thickness of the thin film obtained by separation of part of a single crystal semiconductor substrate is preferably less than or equal to 100 nm, more preferably less than or equal to 50 nm. By forming the transistor 1461 using the thin film as an active layer, the transistor 1461 can be a fully depleted transistor; therefore, the transistor 1461 with high speed operation and low power consumption can be achieved.

The methods and structures described in this embodiment can be combined as appropriate with any of the methods and structures described in the other embodiments.

Embodiment 6

In this embodiment, a semiconductor device which includes the transistor described in any of Embodiments 2 to 4, can hold stored data even when not powered, does not have a limitation on the number of write cycles, and has a structure different from the structure described in Embodiment 6 is described with reference to FIGS. 13A and 13B and FIGS. 14A and 14B.

Figure 13A:
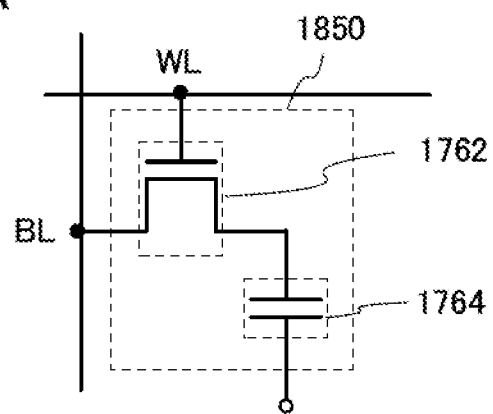
FIGS. 13A and 13B illustrate an example of a structure of a semiconductor device.
Figure 13B:
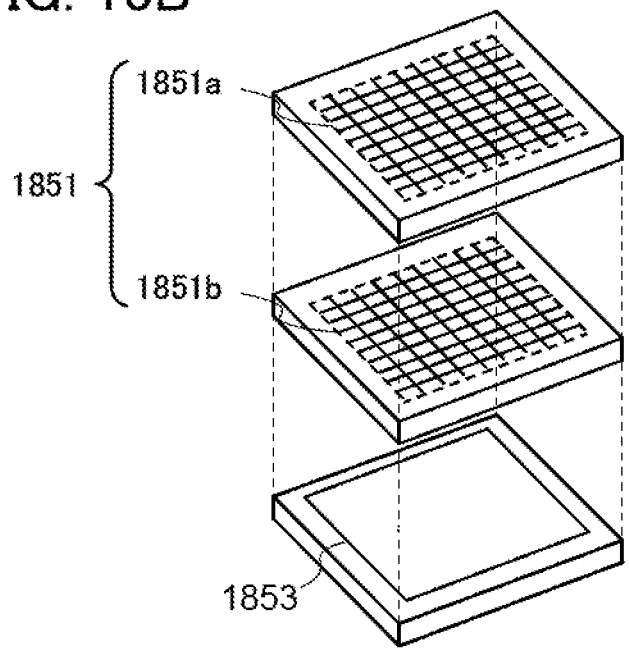

FIG. 13A illustrates an example of a circuit configuration of a semiconductor device, and FIG. 13B is a conceptual diagram illustrating an example of a semiconductor device. First, the semiconductor device illustrated in FIG. 13A is described, and then, the semiconductor device illustrated in FIG. 13B is described.

In the semiconductor device illustrated in FIG. 13A, a bit line BL is electrically connected to a source electrode or a drain electrode of a transistor 1762, a word line WL is electrically connected to a gate electrode of the transistor 1762, and the source electrode or the drain electrode of the transistor 1762 is electrically connected to a first terminal of a capacitor 1764.

Next, writing and holding of data in the semiconductor device (a memory cell 1850) illustrated in FIG. 13A are described.

First, the potential of the word line WL is set to a potential at which the transistor 1762 is turned on, so that the transistor 1762 is turned on. Accordingly, the potential of the bit line BL is supplied to the first terminal of the capacitor 1764 (writing). After that, the potential of the word line WL is set to a potential at which the transistor 1762 is turned off, so that the transistor 1762 is turned off. Thus, the potential at the first terminal of the capacitor 1764 is held (holding).

Off-state current is extremely small in the transistor 1762 which uses an oxide semiconductor. For that reason, a potential of the first terminal of the capacitor 1764 (or a charge accumulated in the capacitor 1764) can be held for an extremely long time by turning off the transistor 1762.

Secondly, reading of data is described. When the transistor 1762 is turned on, the bit line BL which is in a floating state and the capacitor 1764 are electrically connected to each other, and the charge is redistributed between the bit line BL and the capacitor 1764. As a result, the potential of the bit line BL is changed. The amount of a change in potential of the bit line BL varies depending on the potential of the first terminal of the capacitor 1764 (or the charge accumulated in the capacitor 1764).

For example, the potential of the bit line BL after charge redistribution is $(C_B \times V_{B0} + C \times V)/(C_B + C)$, where V is the potential of the first terminal of the capacitor 1764, C is the capacitance of the capacitor 1764, $C_B$ is the capacitance of the bit line BL (hereinafter also referred to as a bit line capacitance), and $V_{B0}$ is the potential of the bit line BL before the charge redistribution. Therefore, it can be found that assuming that the memory cell 1850 is in either of two states in which the potentials of the first terminal of the capacitor 1764 are $V_1$ and $V_0$ ($V_1 > V_0$), the potential of the bit line BL in the case of holding the potential $V_1$ ($= (C_B \times V_{B0} + C \times V_1)/(C_B + C)$) is higher than the potential of the bit line BL in the case of retaining the potential $V_0$ ($= (C_B \times V_{B0} + C \times V_0)/(C_B + C)$).

Then, by comparing the potential of the bit line BL with a predetermined potential, data can be read.

As described above, the semiconductor device illustrated in FIG. 13A can hold charge that is accumulated in the capacitor 1764 for a long time because the off-state current of the transistor 1762 is extremely small. In other words, power consumption can be adequately reduced because refresh operation becomes unnecessary or the frequency of refresh operation can be extremely low. Moreover, stored data can be stored for a long time even when power is not supplied.

Next, the semiconductor device illustrated in FIG. 13B is described.

The semiconductor device illustrated in FIG. 13B includes memory cell arrays 1851*a* and 1851*b* each including a plurality of memory cells 1850 illustrated in FIG. 13A as memory circuits in the upper portion, and a peripheral circuit 1853 in the lower portion which is necessary for operating memory cell arrays 1851 (the memory cell arrays 1851*a* and 1851*b*). Note that the peripheral circuit 1853 is electrically connected to the memory cell arrays 1851.

In the structure illustrated in FIG. 13B, the peripheral circuit 1853 can be provided under the memory cell array 1851 (the memory cell arrays 1851*a* and 1851*b*). Thus, the size of the semiconductor device can be decreased.

It is preferable that a semiconductor material of the transistor provided in the peripheral circuit 1853 is different from that of the transistor 1762 in Embodiment 6. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably obtained by the transistor.

Note that FIG. 13B illustrates, as an example, the semiconductor device in which two memory cell arrays 1851 (the memory cell arrays 1851*a* and 1851*b*) are stacked; however, the number of memory cell arrays to be stacked is not limited thereto. Three or more memory arrays may be stacked.

Next, a specific structure of the memory cell 1850 illustrated in FIG. 13A is described with reference to FIGS. 14A and 14B.

Figure 14A:
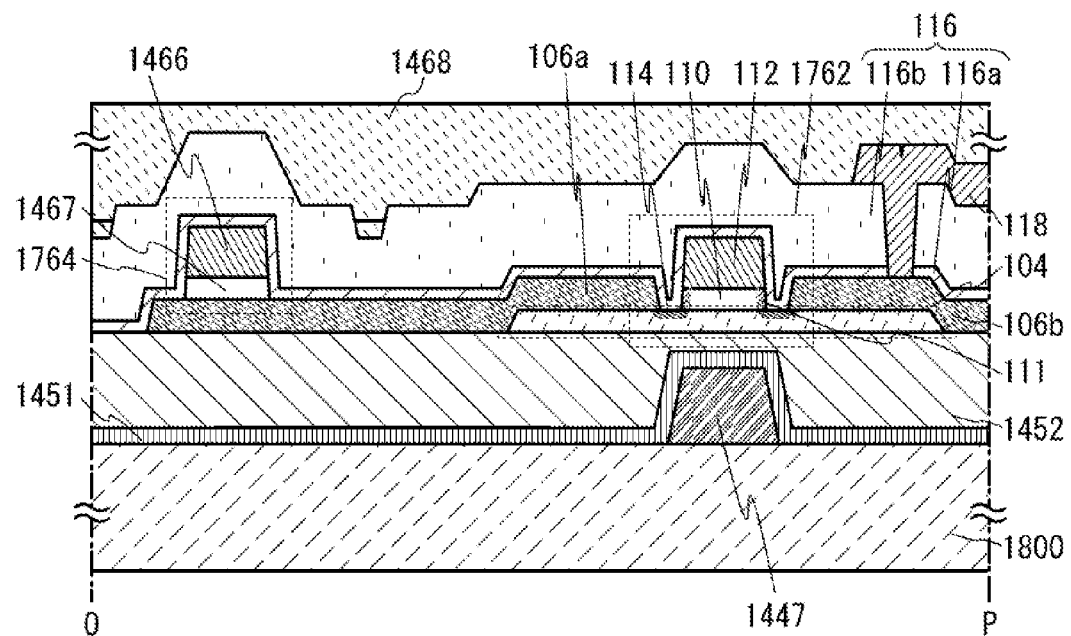
FIGS. 14A and 14B illustrate an example of a structure of a semiconductor device.
Figure 14B:
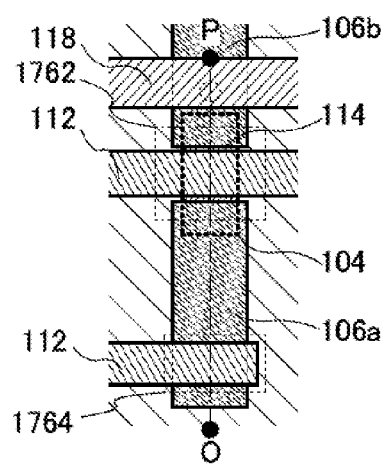

FIGS. 14A and 14B illustrate an example of a structure of the memory cell 1850. FIGS. 14A and 14B are respectively a cross-sectional view and a plan view of the memory cell 1850. Here, FIG. 14A illustrates a cross section taken along line E1-E2 in FIG. 14B.

The transistor 1762 illustrated in FIG. 14A can have the same structure as the semiconductor element 150 described in Embodiment 2. The transistor 1762 is provided over a substrate 1800 with the base film 1452 positioned therebetween. As in Embodiment 5 described above, the conductive film 1447 functioning as a back gate of the transistor 1762 and the insulating film 1451 for suppressing transfer of an impurity which might affect characteristics of the transistor 1762 are provided between the substrate 1800 and the base film 1452.

The transistor 1762 in FIGS. 14A and 14B can have the same structure as the transistor in any of Embodiments 2 to 4. Note that in this embodiment, the detailed description of each component of the transistor 1762 is omitted because the structure of the transistor 1762 is similar to that of the semiconductor element 150 described in Embodiment 2. Further, the detailed description of the capacitor 1764 is omitted because the material and structure of the capacitor 1764 are the same as those of the capacitor 1464 described in Embodiment 5.

The transistor 1762 illustrated in FIG. 14A includes an oxide semiconductor material in the channel formation region. Here, the oxide semiconductor film 104 included in the transistor 1762 is preferably highly purified by removing an impurity such as moisture or hydrogen as much as possible, as described in the above embodiment. Further, the oxide semiconductor film in which oxygen vacancies are sufficiently compensated is preferable. The use of such an oxide semiconductor film makes it possible to lower the off-state current extremely small.

The off-state current of the transistor 1762 is extremely small, which makes it possible to hold stored data for a long time. In other words, refresh operation becomes unnecessary or the frequency of the refresh operation in the semiconductor device can be extremely lowered, which leads to a sufficient reduction in power consumption.

The wiring 118 is formed over the transistor 1762 and the capacitor 1764 through an opening formed in the insulating films 116*a* and 116*b* so as to be electrically connected to the conductive film 106*b*. Note that the wiring 118 correspond to the bit line BL in the circuit diagram of FIG. 13A.

The insulating film 1468 for planarization is provided over the insulating film 116 and the wiring 118.

As described above, the memory cells 1850 are each formed with a transistor including an oxide semiconductor. Since the off-state current of the transistor including an oxide semiconductor is small, stored data can be held for a long time owing to such a transistor. In other words, the frequency of refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

As described above, a miniaturized and highly-integrated semiconductor device having high electrical characteristics and a method for manufacturing the semiconductor device can be provided.

This embodiment can be implemented in appropriate combination with any of the structures described in the other embodiments.

Embodiment 7

A semiconductor element disclosed in this specification or the like can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment are described.

Figure 15A:
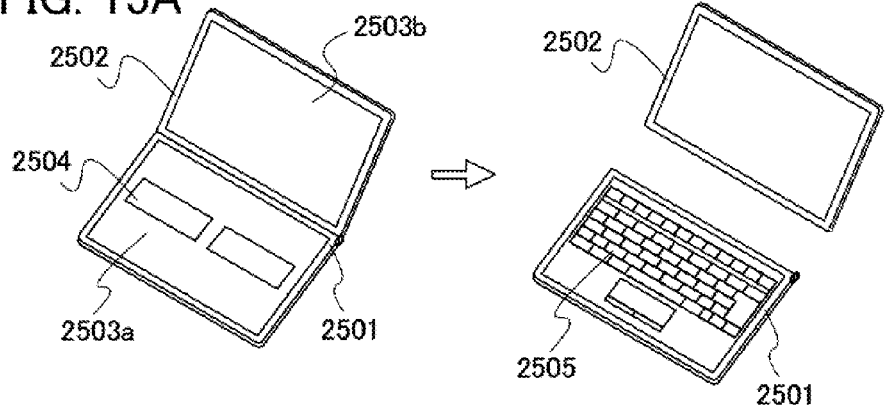
FIGS. 15A to 15E each illustrate an electronic device.

FIG. 15A illustrates a personal computer which includes a housing 2501, a housing 2502, a first display portion 2503*a*, a second display portion 2503*b*, and the like. A variety of electronic components (e.g., CPU, MPU, or a memory element) are incorporated inside the housing 2501 and the housing 2502. Further, electronic circuits (e.g., a driver circuit and a selection circuit) necessary for displaying an image are mounted on the first display portion 2503*a* and the second display portion 2503*b*. The semiconductor element described in any of the above embodiments is used in these electronic components and electronic circuits, whereby a portable information terminal with high performance and high reliability can be provided. Note that the semiconductor device according to any of the above embodiments is preferably provided in at least one of the housing 2501 and the housing 2502.

At least one of the first display portion 2503*a* and the second display portion 2503*b* is a touch panel, and for example, as illustrated in the left in FIG. 15A, which of "touch input" and "keyboard input" is performed can be selected by a selection button 2504 displayed on the first display portion 2503a. Since the selection button with a variety of sizes can be displayed, the portable information terminal can be easily used by people of any generation. In the case where "touch input" is selected, for example, a keyboard 2505 is displayed on the first display portion 2503a as illustrated in the right in FIG. 15A. With such a structure, letters can be input quickly by keyboard input as in the case of using a conventional information terminal, for example.

Further, the housing 2501 and the housing 2502 of the portable information terminal in FIG. 15A can be separated as illustrated in the right in FIG. 15A. This structure enables very convenient operations; for example, screen data can be controlled from the housing 2502 while the screen data is shared by a plurality of people with the housing 2501 hung on a wall. Note that in the case where the device is not in use, the housing 2501 and the housing 2502 are preferably made to overlap such that the first display portion 2503 a faces the second display portion 2503b. In this manner, the first display portion 2503a and the second display portion 2503b can be protected from an external shock. The first display portion 2503 a can also function as a touch panel for a reduction in weight to carry around to be operated by one hand while the other hand supports the housing 2502, which is very convenient.

The portable information terminal illustrated in FIG. 15A can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a recording medium insertion portion, and the like may be provided on the back surface or the side surface of the housing.

The portable information terminal illustrated in FIG. 15A may transmit and receive data wirelessly. Through wireless communication, desired book data or the like can be purchased and downloaded from an electronic book server.

Further, the housing 2501 or the housing 2502 illustrated in FIG. 15A may be equipped with an antenna, a microphone function, or a wireless communication function, so that the portable information terminal may be used as a mobile phone.

Figure 15B:
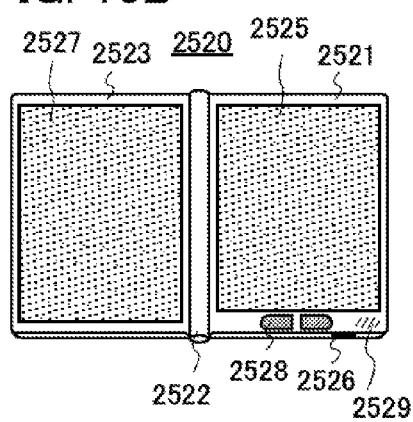

FIG. 15B illustrates an example of an e-book reader. For example, an e-book reader 2520 includes two housings of a housing 2521 and a housing 2523. The housing 2521 and the housing 2523 are combined with a hinge 2522 so that the e-book reader 2520 can be opened and closed with the hinge 2522 as an axis. With such a structure, the e-book reader 2520 can operate like a paper book.

A display portion 2525 and a display portion 2527 are incorporated in the housing 2521 and the housing 2523, respectively. The display portion 2525 and the display portion 2527 may display one image or different images. In the case where the display portion 2525 and the display portion 2527 display different images, for example, text can be displayed on a display portion on the right side (the display portion 2525 in FIG. 15B) and images can be displayed on a display portion on the left side (the display portion 2527 in FIG. 15B). By applying the semiconductor element described in any of the above embodiments, the e-book reader 2520 can have high performance and high reliability.

FIG. 15B illustrates an example in which the housing 2521 is provided with an operation portion and the like. For example, the housing 2521 is provided with a power switch 2526, an operation key 2528, a speaker 2529, and the like. The page can be turned with the operation key 2528. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 2520 may have a function of an electronic dictionary.

The e-book reader 2520 may be configured to transmit and receive data wirelessly. Through wireless communication, desired book data or the like can be purchased and downloaded from an electronic book server.

Figure 15C:
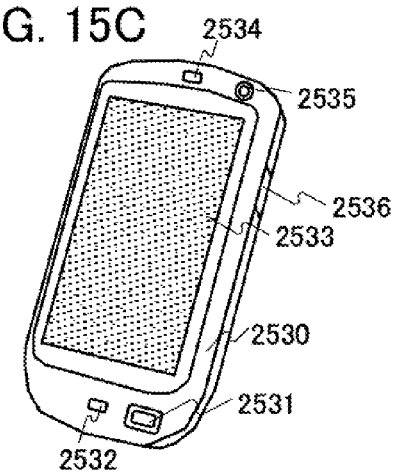

FIG. 15C illustrates a smartphone, which includes a housing 2530, a button 2531, a microphone 2532, a display portion 2533 provided with a touch panel, a speaker 2534, and a camera 2535 and functions as a mobile phone. By applying the semiconductor element described in the above embodiments, the smartphone can have high performance and high reliability.

The display portion 2533 changes the direction of display as appropriate depending on a use mode. Since the camera 2535 is provided on the same plane as the display portion 2533, videophone is possible. The speaker 2534 and the microphone 2532 can be used not only for voice calls, but also for video phone calls, recording, playing sound, and the like.

An external connection terminal 2536 can be connected to an AC adapter and various types of cables such as a USB cable, and charging and data communication with a personal computer are possible. Furthermore, a large amount of data can be stored and moved by inserting a storage medium into the external memory slot (not illustrated).

Further, in addition to the above functions, an infrared communication function, a television reception function, or the like may be provided.

Figure 15D:
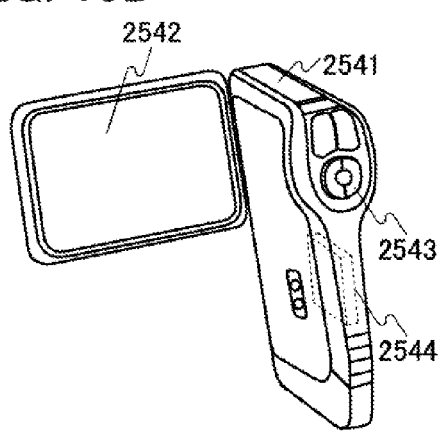

FIG. 15D illustrates a digital video camera which includes a main body 2541, a display portion 2542, an operation switch 2543, a battery 2544, and the like. By applying the semiconductor element described in any of the above embodiments, the digital video camera can have high performance and high reliability.

Figure 15E:
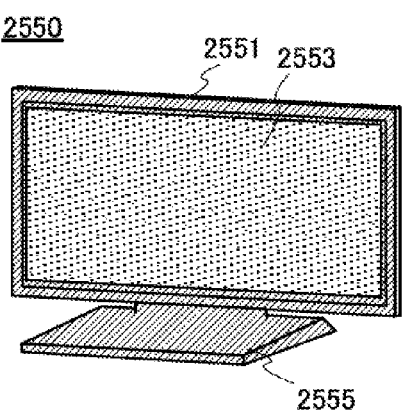

FIG. 15E illustrates an example of a television set. In a television set 2550, a display portion 2553 is incorporated in a housing 2551. The display portion 2553 can display images. In this example, the housing 2551 is supported by a stand 2555. By applying the semiconductor device described in any of the above embodiments, the television set 2550 can have high reliability.

The television set 2550 can be operated with an operation switch of the housing 2551 or a separate remote controller. Further, the remote controller may be provided with a display portion for displaying data output from the remote controller.

Note that the television set 2550 is provided with a receiver, a modem, and the like. Moreover, when the display device is connected to a communication network with or without wires via the modem, one-way (from a sender to a receiver) or two-way (between a sender and a receiver or between receivers) information communication can be performed.

The methods and structures described in this embodiment can be combined as appropriate with any of the methods and structures described in the other embodiments.

This application is based on Japanese Patent Application serial No. 2012-081477 filed with Japan Patent Office on Mar. 30, 2012, the entire contents of which are hereby incorporated by reference.

What is claimed is:

1. A semiconductor element comprising:
   an oxide semiconductor film over an insulating surface;
   a gate insulating film over the oxide semiconductor film; and
   a gate electrode over the oxide semiconductor film with the gate insulating film interposed therebetween,
   wherein a side surface of the gate insulating film and a side surface of the gate electrode are aligned with each other,
   wherein the gate insulating film comprises a first region which includes the side surface of the gate insulating film, and a second region which does not include the side surface of the gate insulating film, and
   wherein a nitrogen content of the first region is higher than a nitrogen content of the second region.

2. The semiconductor element according to claim 1, further comprising:
   a first conductive film and a second conductive film over the oxide semiconductor film; and
   an insulating film over the first conductive film and the second conductive film,
   wherein the oxide semiconductor film comprises a third region overlapping with the gate electrode, a fourth region overlapping the first conductive film or the second conductive film, and a fifth region in contact with the insulating film, and
   wherein a nitrogen content of the fifth region is higher than a nitrogen content of the third region.

3. The semiconductor element according to claim 2,
   wherein the fifth region comprises an upper portion and a lower portion, and
   wherein a nitrogen content of the upper portion is higher than a nitrogen content of the lower portion.

4. The semiconductor element according to claim 2, wherein a content of the fourth region is higher than the nitrogen content of the third region.

5. The semiconductor element according to claim 4,
   wherein the fourth region comprises an upper portion and a lower portion, and
   wherein a nitrogen content of the upper portion is higher than a nitrogen content of the lower portion.

6. The semiconductor element according to claim 1, the oxide semiconductor film comprising a c-axis aligned crystal.

7. The semiconductor element according to claim 1, the oxide semiconductor film comprising indium, gallium, and zinc.

* * * * *

UNITED STATES PATENT AND TRADEMARK OFFICE
CERTIFICATE OF CORRECTION

PATENT NO. : 8,941,113 B2
APPLICATION NO. : 13/803022
DATED : January 27, 2015
INVENTOR(S) : Toshihiko Takeuchi and Kosei Noda It is certified that error appears in the above-identified patent and that said Letters Patent is hereby corrected as shown below:

In the specification

Column 6, line 25, after "boundary" insert --.--; and

In the claims

Column 38, line 14, claim 4, after "wherein a" insert --nitrogen--.

Signed and Sealed this
Twenty-fourth Day of November, 2015

Michelle K. Lee
*Director of the United States Patent and Trademark Office*